US006529808B1

(12) United States Patent
Diem

(10) Patent No.: US 6,529,808 B1
(45) Date of Patent: Mar. 4, 2003

(54) METHOD AND SYSTEM FOR ANALYZING AN ON-BOARD VEHICLE COMPUTER SYSTEM

(75) Inventor: Earl D. Diem, Ortonville, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/127,248

(22) Filed: Apr. 22, 2002

(51) Int. Cl.[7] .................................................. G06F 7/00
(52) U.S. Cl. ............................ 701/29; 701/30; 701/33; 702/185
(58) Field of Search ............................ 701/29, 30, 31, 701/32, 33, 36; 702/185

(56) References Cited

U.S. PATENT DOCUMENTS

| | | | |
|---|---|---|---|
| 5,729,452 A | 3/1998 | Smith et al. | 701/29 |
| 5,835,871 A | 11/1998 | Smith et al. | 701/29 |
| 6,285,931 B1 | 9/2001 | Hattori et al. | 701/29 |
| 6,339,736 B1 | 1/2002 | Moskowitz et al. | 701/29 |
| 6,430,164 B1 * | 8/2002 | Jones et al. | 370/313 |

OTHER PUBLICATIONS

Arvon L. Mitcham, "On–Board Diagnostic Hand–Held Scan Tool Technology: Adherence to the Society of Automotive Engineers Requirements for Scan Tools and an Evaluation of Overall Scan Tool Capability," EPA Report, EPA420–R–00–017 Oct. 2000, pp. 1–27.

David Sosnowski and Edward Gardetto, "Performing Onboard Diagnostic System Checks as Part of a Vehicle Inspection and Maintenance Program," EPA Air and Radiation Report, EPA420–R–01–015 Jun. 2001, pp. 1–46.

* cited by examiner

*Primary Examiner*—Gertrude Arthur
(74) *Attorney, Agent, or Firm*—Edmond P. Anderson

(57) ABSTRACT

An On-Board Diagnostics/Inspection Maintenance (OBD/IM) Vehicle Analysis System (OVAS) includes the hardware and software necessary to access the onboard computer systems on 1996 and newer vehicles, determine On-Board Diagnostics Generation II (OBDII) readiness, and recover stored fault codes using the Society of Automotive Engineers (SAE) standardized link. The analyzer is designed to guide the inspector through the OBDII inspection sequence for a particular vehicle and record the results. Information regarding OBDII scanning anomalies (such as "not ready" status of 1996 Subarus) is maintained in the OBD Vehicle Lookup Table (VLT). In addition, information regarding the Data Link Collector (DLC) location is maintained for 1996 and newer vehicles in the OBD-VLT. This information is downloaded to the OVAS analyzers upon initialization and when the OBD-VLT is updated, and is automatically displayed when vehicles undergoing testing match the vehicle criteria (such as make, model, and model year).

19 Claims, 31 Drawing Sheets

ATRi OBD/IM Vehicle Analysis System (OVAS)

Facility # 88888    Analyzer # 88888888    Inspector # [Inspector #]    Get New

Registration Scan    Re-scan    OK

Customer Information:

- First name
- Mid Initial
- Last name
- Address 1
- Address 2
- City
- State
- Zip
- Telephone Vehicle Information:

- VIN    Help
- License plate
- Odometer
- Model_Year
- Make
- Model    Body Type
- Test type: Initial ● Retest ○
- Start Test
- Set Server IP

Does driver have a valid registration for the vehicle?

Yes    No

Abort

FIG. 2A

OVAS by ATRi (BETA)
Help

Inspect the Tires and Wheels.

Are the tires and wheels in satisfactory condition for continued operation?

[ Yes ]     [ No ]

[ Abort ]

FIG. 2 B

OVAS by ATRi (BETA)
Help

Inspect the Steering and Suspension systems.

Are the the steering and suspension systems in satisfactory condition for continued operation?

[ Yes ]     [ No ]

[ Abort ]

FIG. 2 C

OVAS by ATRi (BETA)
Help

Inspect the Brake System.

Is the brake system in satisfactory condition for continued operation?

[Yes]   [No]

[Abort]

FIG. 2 D

OVAS by ATRi (BETA)
Help

Inspect the Lighting and Electrical systems.

Are the the lighting and electrical systems in satisfactory condition for continued operation?

[Yes]   [No]

[Abort]

FIG. 2 E

OVAS by ATRi (BETA)
Help

Inspect the Exhaust system.

Is the exhaust system in satisfactory condition for continued operation?

[Yes]   [No]

[Abort]

FIG. 2 H

OVAS by ATRi (BETA)
Help

Inspect the Fuel system.

Is the fuel system in satisfactory condition for continued operation?

[Yes]   [No]

[Abort]

FIG. 2 I

OVAS by ATRi (BETA)
Help

Inspect the Emission Control system.

Is the emission control system in satisfactory condition for continued operation?

[ Yes ]   [ No ]

[ Abort ]

FIG. 2 J

OVAS by ATRi (BETA)
Help

Inspect the Catalytic Converter.

Is the catalytic converter in satisfactory condition for continued operation?

[ Yes ]   [ No ]

[ Abort ]

FIG. 2 K

METHOD AND SYSTEM FOR ANALYZING AN ON-BOARD VEHICLE COMPUTER SYSTEM

BACKGROUND

The present disclosure relates generally to vehicle Onboard Diagnostic (OBD) systems and, more particularly, to a method and system for analyzing OBD data in accordance with a vehicle inspection and maintenance program.

The Clean Air Act as amended in 1990 (CAA) requires the Environmental Protection Agency (EPA) to set guidelines for states to follow in designing and running vehicle inspection and maintenance (I/M) programs. As well as distinguishing between basic and enhanced I/M programs, these guidelines must clarify how states are to meet other minimum design requirements set by the CAA. One such requirement that applies to both basic and enhanced I/M programs is the performance of Onboard Diagnostic (OBD) system checks as part of a required, periodic vehicle inspection.

Typically, states utilize computer systems in various implementations to direct and assist inspectors in performing safety and emissions inspections. Currently, states perform the emissions inspection of motor vehicles by analyzing the exhaust of the vehicle under simulated driving conditions. Since 1996, however, both foreign and domestic motor vehicles have been provided with an Onboard Diagnostics (OBD) capability. An OBD system is a system of vehicle component and condition monitors controlled by a central, onboard computer. The OBD computer uses software designed to signal the motorist when conditions exist that could lead to a vehicle's exceeding its emission standards by 1.5 times the standard. Accordingly, as part of an overall vehicle inspection and maintenance (I/M) program under the Clean Air Act, each state will now be required to incorporate a check of a vehicle's OBD computer as part of these programs to perform the emissions inspection.

An OBD-I/M check generally includes two types of examination. First, an inspector performs a visual check of the dashboard display function and status (also referred to as the malfunction indicator light "MIL" and/or bulb check). A second procedure is an electronic examination and analysis of the OBD computer itself. Generally speaking, a scan tool or similar hand-held instrument is used to extract emissions data from the vehicle OBD computer in the form of standardized Diagnostic Trouble Codes (DTCs).

Due to the relative newness of standardized OBD systems (also referred to as On-Board Diagnostics Generation II or OBD II), certain difficulties have arisen. For example, certain vehicle models are not currently compatible with OBD software from the standpoint of "readiness". Readiness refers to whether or not the vehicle's computer has had the opportunity to fully monitor and evaluate the vehicle's performance. Thus, the OBD stores a status flag or "readiness code" for each monitor. The readiness code is different from a DTC in that the readiness code does not indicate a vehicle fault, but rather whether or not a given monitor has been run (i.e., whether or not the component or system in question has been checked to determine if it is functioning properly). In some vehicles, the readiness codes may be cleared at key off. In other vehicles, a "trip based" design may cause catalyst and evaporative monitors to reflect a "not ready" state. In either case, such scanning anomalies are not taken into account by existing OBD scanning systems.

Another difficulty encountered with OBD-I/M programs is in locating the Data Link Connector (DLC) for certain vehicles. The DLC is the interface between a vehicle's OBD computer and the OBD scanner. Connecting an OBD scanner to the DLC allows I/M inspectors and vehicle repair technicians to read the readiness status of the vehicle's various onboard monitors as well as any DTCs. Although the DLC is usually located under the dashboard on the driver's side of a vehicle, this is not always the case. While the EPA has compiled a listing of vehicles with hard-to-find DLC locations by make and model year, such information may not be readily or conveniently accessible by the inspector.

SUMMARY

The above discussed and other drawbacks and deficiencies of the prior art are overcome or alleviated by a method for on-board diagnostics testing of a vehicle under inspection. In an exemplary embodiment, the method includes configuring a user interface in communication with a software system, and configuring a communications link in communication with the software system. The software system is capable of communicating with an on-board vehicle computer system. In addition, an analysis and reporting module is configured in communication with said software system, wherein the software system manages the user interface, the communications link, and the analysis and reporting module in a manner guiding an inspector through an inspection of the vehicle. An inspection of the vehicle includes an analysis of the on-board vehicle computer system.

In one embodiment, the method further includes receiving inputted vehicle data fields for the vehicle under inspection, comparing the inputted vehicle data fields to data contained in a vehicle lookup table, and determining whether the vehicle under inspection is subject to on-board diagnostics testing. If the vehicle under inspection is subject to on-board diagnostics testing, then the software system guides an inspector through a vehicle inspection process.

In a further aspect, if the vehicle under inspection is subject to on-board diagnostic testing, then based upon the inputted vehicle data fields and the data contained in the vehicle lookup table, it is determined whether the vehicle under inspection is subject to a standardized test procedure or a specialized test procedure corresponding to the vehicle under inspection. If it is determined that the vehicle under inspection is subject to a specialized test procedure, then the software system guides the inspector through the specialized test procedure.

In yet a further aspect, the method includes directing the inspector to locate an on-board diagnostic connector in the vehicle under inspection, wherein information on the location of the on-board diagnostic connector is also included in the vehicle lookup table. Furthermore, communication between the analysis and reporting module and the on-board vehicle computer system is established. Then, the operational status of a malfunction indicator light (MIL) included within said vehicle under inspection is verified. It is then determined whether the MIL has been commanded on during the operation of the vehicle under inspection, and vehicle diagnostic trouble codes are retrieved and stored.

In still a further aspect, a readiness status is determined for each of a set of vehicle parameter monitors, the readiness status indicative of whether a given vehicle parameter monitor has had sufficient time to monitor the parameter associated therewith. A possible readiness status for each vehicle parameter monitor includes one of: completed, not completed, and not enabled. The set of vehicle parameter monitors includes at least one of: a misfire, a fuel system, a comprehensive component, a catalyst, a heated catalyst, an evaporative system, a secondary air system, an air conditioning system, an oxygen sensor, an oxygen sensor heater, and an exhaust gas recirculation system monitor.

BRIEF DESCRIPTION OF THE DRAWINGS

Referring to the exemplary drawings wherein like elements are numbered alike in the several Figures.

DETAILED DESCRIPTION

Disclosed herein is a method and system that includes both hardware and software used to access the onboard computer systems for model year 1996 and newer vehicles (i.e., those vehicles featuring OBD capability), to determine On-Board Diagnostics Generation II (OBD II) readiness as defined by Title 40 of the Code of Federal Regulations (CFR), and to recover stored fault codes using the Society of Automotive Engineers (SAE) standardized link. The method and system is further designed to guide an inspector through the OBD inspection sequence for a particular vehicle and record the results.

Information regarding OBD II scanning anomalies (e.g., the "not ready" status characteristic of 1996 Subaru vehicles) is maintained in an OBD Vehicle Lookup Table (VLT). In addition, information regarding specific Data Link Collector (DLC) location is also maintained for 1996 and newer vehicles in the OBD-VLT. This information is downloaded to an analyzer upon system initialization (and when the OBD-VLT is updated), and is also automatically displayed on a display of the analyzer whenever a tested vehicle matches certain criteria such as make, model, and model year.

The system software is designed to conform to the requirements of Title 40 Code of Federal Regulations Title 51, except as noted hereinafter. The provisions of Title 40 of the Code of Federal Regulations are incorporated herein by reference. Furthermore, the SAE J1979 document pertaining to communication via the Data Link Collector is also incorporated herein by reference.

Figure 1:
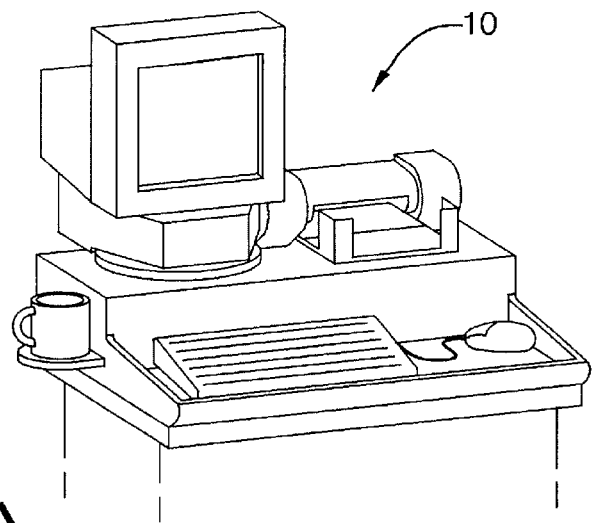
FIG. 1a depicts an OBD analysis and reporting module, embodied by and OBD analyzer, including a personal computer and an initial test screen for display, in accordance with an embodiment of the invention.
FIG. 1b illustrates an alternative embodiment of an OBD system, including a server based PC network.
FIG. 1c illustrates still an alternative embodiment of an OBD system, including a server based wireless network of CE devices.
FIG. 1d illustrates an exemplary, hand held CE device of the embodiment of FIG. 1c.
Figure 1:
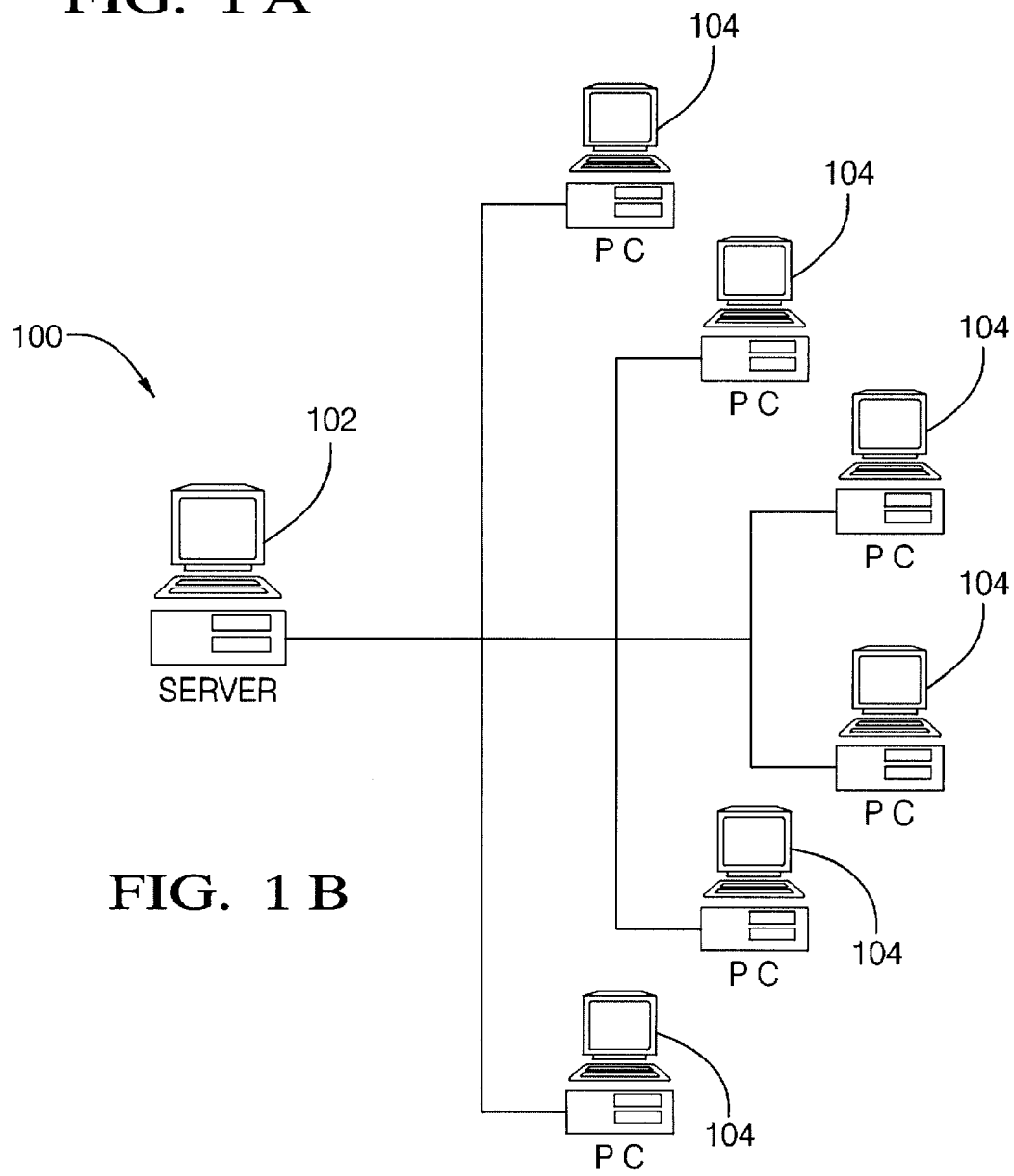
Figure 1:
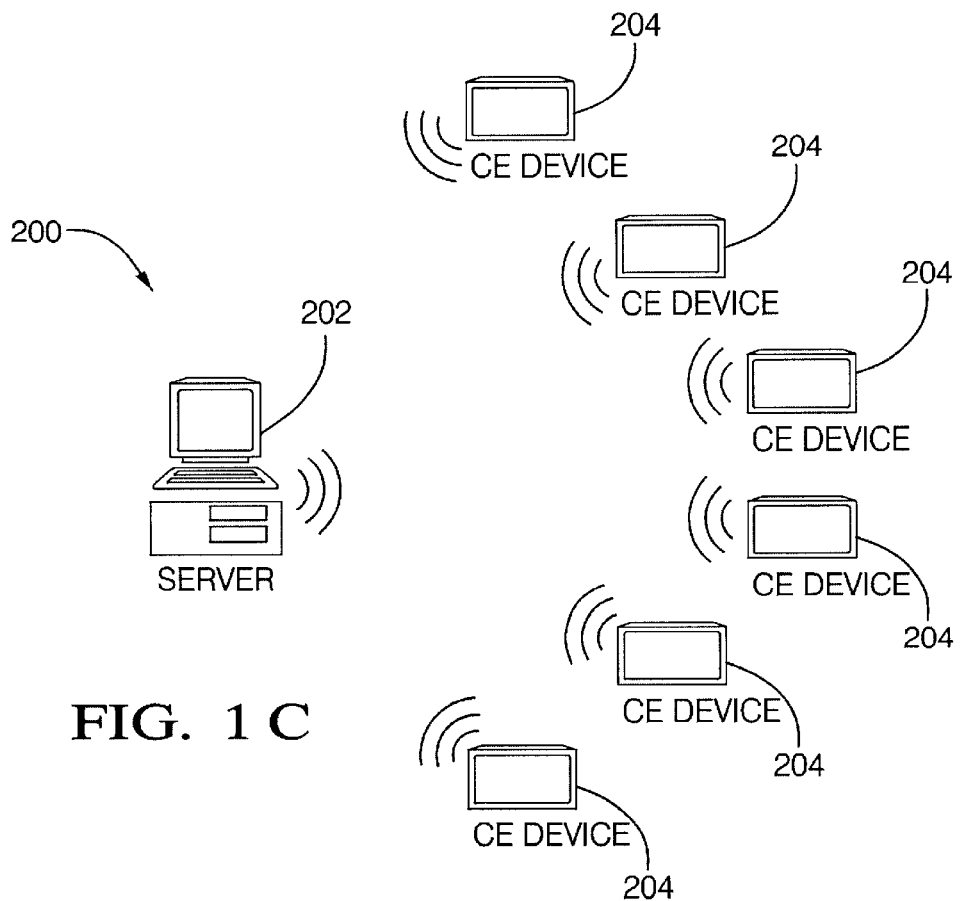
Figure 1:
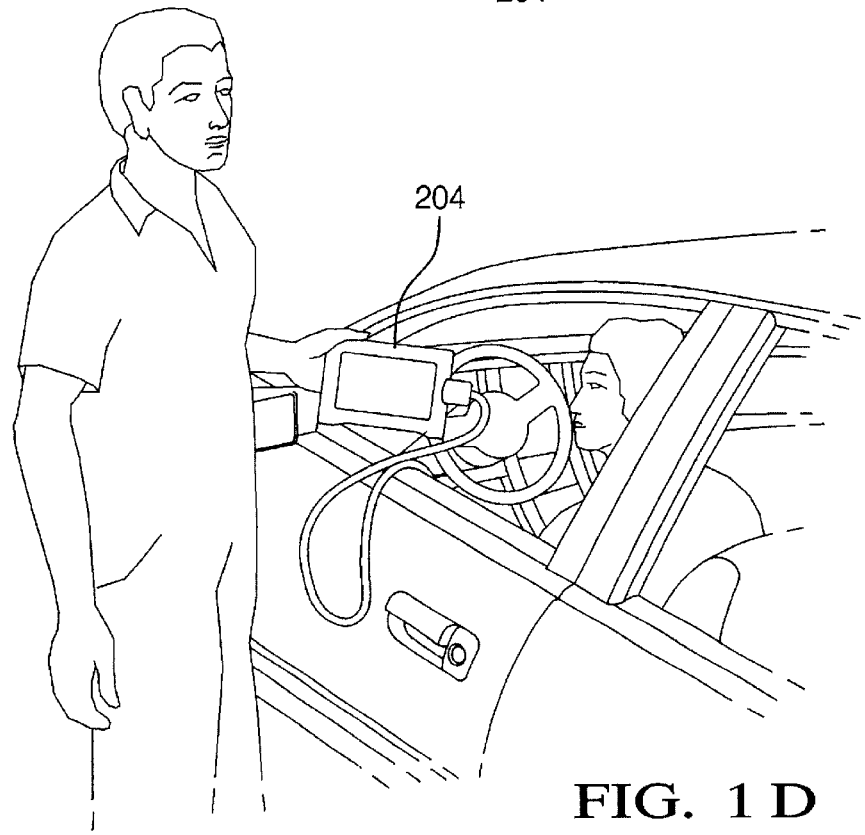
Figure 2:
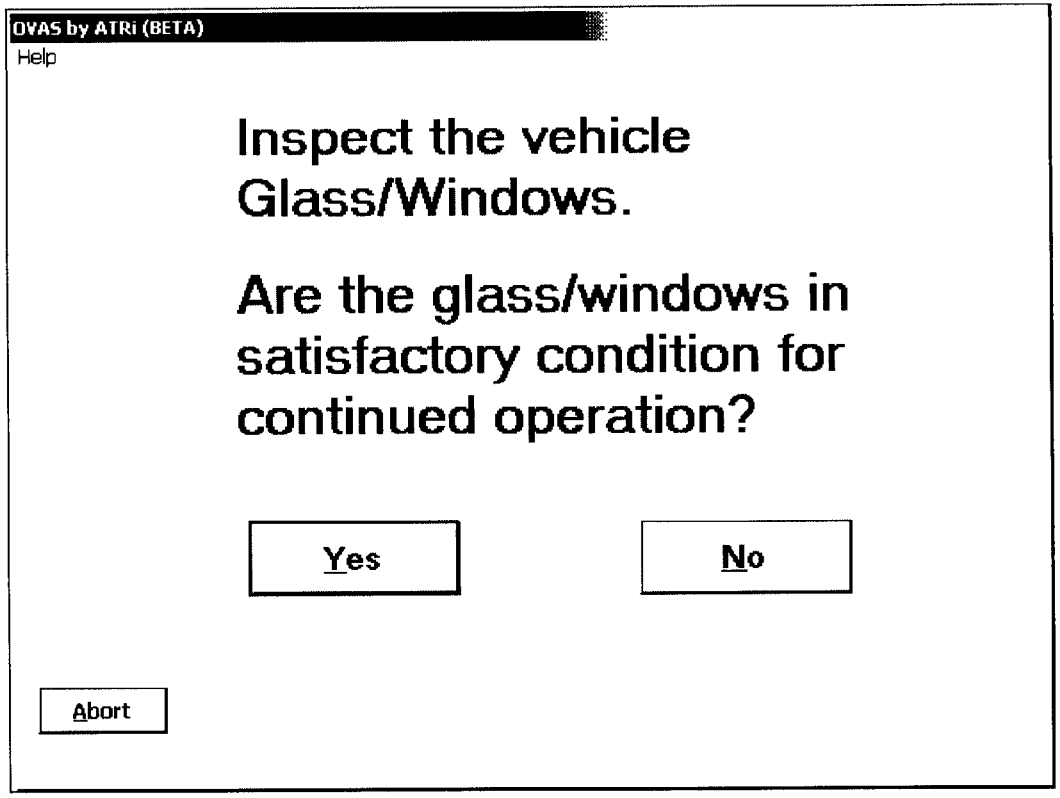
FIGS. 2–14 depict screen shots of exemplary prompts displayed on a display device of the present invention embodiments.
Figure 2:
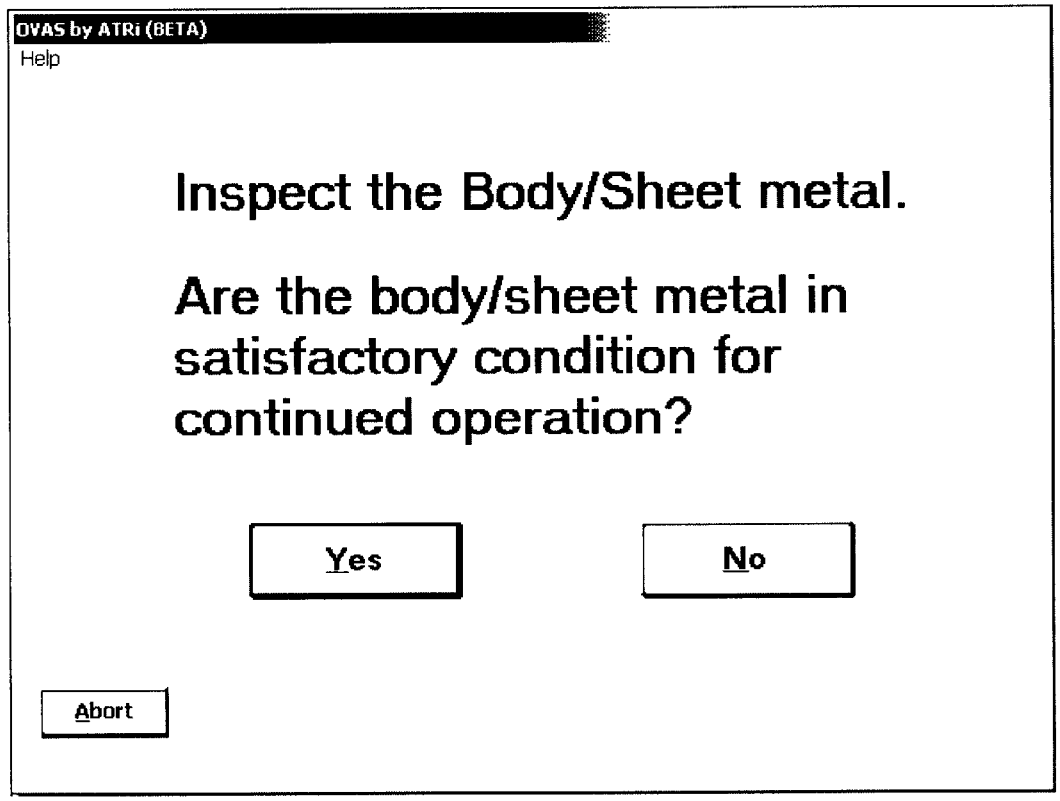
Figure 2:
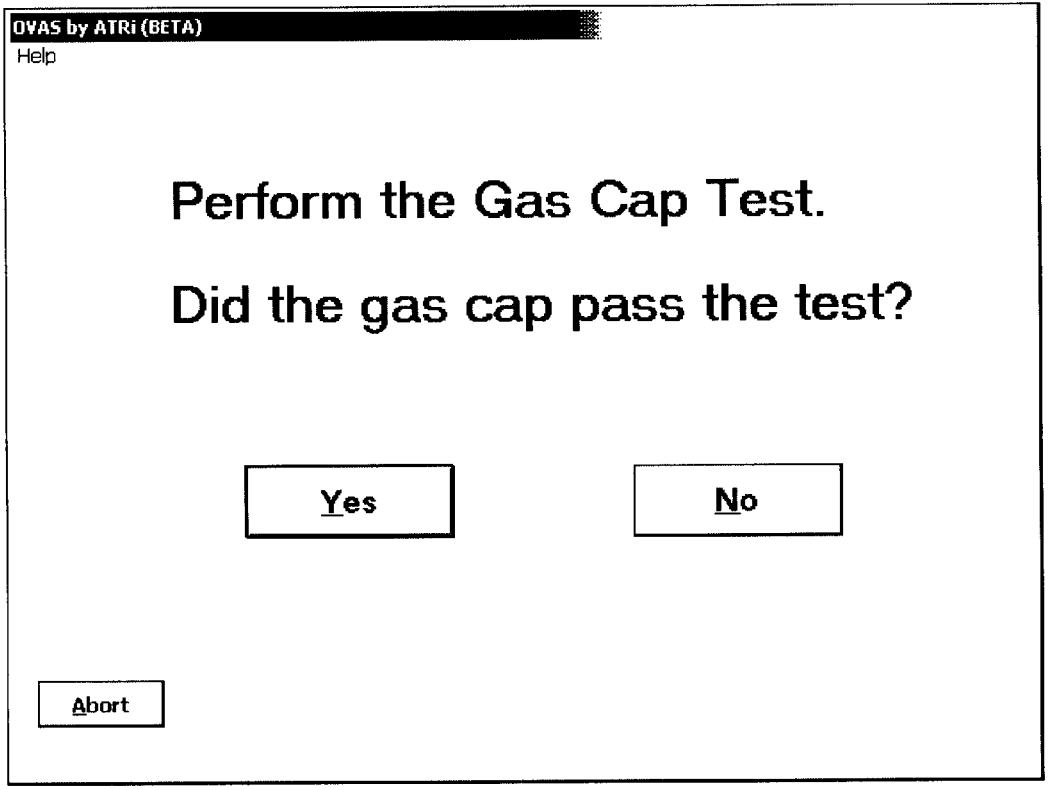

Referring initially to FIG. 1a, there is shown an OBD analysis and reporting module, in the form of an analyzer 10 in accordance with an embodiment of the invention. The analyzer 10 in this embodiment forms a "stand-alone" system that includes a personal computer on which system software is loaded and run. The analyzer 10 is further coupled through an interface cable (not shown) to the on-board computer of a motor vehicle (not shown). Focused on decentralized testing, the stand-alone analyzer 10 supports the OBD-I/M automated test procedure and database operations on a single Windows® 98/ME terminal. In addition, bar code scanning is supported along with other system options. Database information reporting is accomplished in a "push" design to a central location.

FIG. 1b illustrates an alternative embodiment for an OBD system 100 in which the OBD software is loaded and run from a server 102, and which is further accessible by a plurality of personal computers 104 in communication with the server 102. Such a networked PC system thus enables the OBD diagnostic software to be run by personal computers 104 that may be located in different areas of a workplace.

Focused on centralized testing, the OBD system 100 supports the OBD-I/M automated test procedure on networked Windows® 98/ME terminals 104 functioning as clients. The OBD test analysis and database operations are accomplished via a server application, residing locally and networked to the client PCs 104. As with the stand-alone analyzer of FIG. 1a, bar code scanning is supported along with other system options. Database reporting is accomplished in a push design to a central location. Network communications may be implemented via Transport Control Protocol/Internet Protocol (TCP/IP) protocol over a wired or a Radio Frequency (RF) network, depending on the client's specification.

FIG. 1c illustrates still an alternative embodiment of an OBD system 200 in which a central server 202 has the OBD software loaded thereon and is used to communicate, in a wireless network, with a plurality of Windows® CE hand held devices 204. One such CE device 204 is illustrated in FIG. 1d being coupled to a J1978 interface bus of a vehicle. This embodiment, which also focuses on centralized testing, supports the OBD-I/M automated test procedure on the networked Windows® CE terminal devices 204 functioning as clients. Test analysis and database operations are accomplished via a server application, residing locally and networked to the client CEs. Bar code scanning is supported along with other system options. Reporting from each terminal device 204 is accomplished in a push design to a central location. Network communications are accomplished via TCP/IP protocol over a RF network.

It will thus be appreciated that the diagnostic software of the present invention embodiments, as is described hereinafter, may be implemented from a variety of different computing and/or digital devices. The exemplary hardware systems illustrated in FIGS. 1a–1d, however, should not be construed as limiting the implementation of the present disclosure, as other forms of implementation will become apparent to those skilled in this area of art.

OBD-I/M Inspection Sequences

The following section describes the display prompts, error messages and programming criteria that may be used for performing an exemplary OBD II inspection. An exemplary initial test screen is shown in FIG. 1e. The data fields shown therein may be entered by various means, such as by manually typing in the information or by scanning a bar code associated with the vehicle registration. FIGS. 2a–2l are user interface screens that may be used to facilitate an integration of the OBD system with a state's safety and emissions inspection process, wherein the computer system helps to guide an inspector through the entire inspection process.

In accordance with EPA rules, vehicles subject to an OBD inspection include model year 1996 and newer gasoline powered vehicles and model year 1997 and newer diesel powered vehicles with a gross vehicle weight rating (gvwr) of 8,500 pounds or less. Thus, for example, the analyzer 10 (in the embodiment of FIG. 1a) prompts an inspector to perform the OBDII check on all passenger vehicles and light-duty trucks whose model year is equal to or newer than the vehicle model year contained in the year field (OBD MODEL_YR) of an OBD test data file (OBDTEST.DAT). Beginning on the date specified in the OBD fail start date field (OBD_FAIL_START DATE) of a QUE test data file (QUETEST.DAT), vehicles that fail the OBD test also fail the overall emissions test. However, the OBD inspection portion of the overall test is bypassed if the OBD enabled field (OBD ENABLED) of QUETEST.DAT is set to false ("F").

In addition, vehicles having unusual OBD II test characteristics (such as readiness resetting upon ignition shut-off, described earlier) are listed in a Vehicle Lookup Table (VLT). The VLT information identifies vehicles requiring special treatment, including the following aspects:

Key-on/engine-off (KOEO) test—does light go off after coming on?

Scan tool hook-up—does vehicle need to be off more than 10 seconds before returning to KOEO position?

Readiness—should vehicle be subject to different readiness criteria?

When a vehicle has been identified as one requiring a unique test procedure, the analyzer 10 provides an information screen at the appropriate point advising the inspector how to proceed with the inspection, based on information listed in the VLT. The analyzer 10 makes any changes in test sequence logic, such as a change in the number of allowed readiness codes not set. One exemplary OBDII Key On, Engine Off (KOEO) Test Prompt is as follows:

PERFORM THE "KEY ON, ENGINE OFF" CHECK TO DETERMINE IF THE INSTRUMENT PANEL MALFUNCTION INDICATOR LIGHT (MIL) ILLUMINATES WHEN THE IGNITION KEY IS TURNED TO THE "KEY ON, ENGINE OFF" POSITION.

DOES THE MIL ILLUMINATE (e.g. 'COME ON', 'LIGHT UP') WHEN THE KEY IS PLACED IN THE "KEY ON, ENGINE- OFF" POSITION?

"Y"—YES, THE MIL 'COMES ON' OR 'LIGHTS UP'.

"N"—NO, THE MIL DOES NOT 'COME ON' OR 'LIGHT UP'.

THE MALFUNCTION INDICATOR LIGHT (MIL) WILL EITHER DISPLAY "SERVICE ENGINE SOON" "CHECK ENGINE," THE WORD "CHECK" ALONG WITH THE INTERNATIONAL ENGINE SYMBOL, OR SOME COMBINATION OF THESE DEPENDING ON THE VEHICLE MAKE.

Thus, as indicated above, the analyzer 10 asks the inspector to perform a key-on/engine-off check to see if the Malfunction Indicator Light/Check Engine Light (MIL) is illuminated while the engine is not running. The analyzer 10 prompts the inspector to enter a "No" if the MIL is not illuminated while the engine is not running. The results (Y or N) of this check are entered into the OBD MIL check field (OBD_MIL_CHECK) of the vehicle data file (VEHICLE.DAT).

On those vehicles having a MIL that illuminates very briefly when the key is turned to the KOEO position and then goes out (as indicated by the OBDVLT), the following additional message is provided:

THE MIL WILL ILLUMINATE VERY BRIEFLY WHEN THE KEY IS TURNED TO THE KOEO POSITION AND THEN GO OUT.

In order to assist an inspector in this regard, a help message for this particular screen includes the following text:

"The 'Malfunction Indicator Light' (MIL) is the official term for the warning light that is illuminated by the vehicle's OBD system when a malfunction occurs. Depending on the vehicle make, the MIL either displays 'Service Engine Soon', 'Check Engine', the word 'Check' along with the international engine symbol, or some combination of these. The MIL must come on when the ignition key is turned to the 'key on, engine off' position. This is to allow inspectors to check that the MIL is capable of illuminating if a malfunction were to occur. On most vehicles, the MIL stays illuminated as long as the key is in the 'ON' position. However, on some vehicles, the MIL illuminates very briefly when the key is turned to the 'key on, engine off' position and then goes out."

Assuming there are no problems with the illumination of the MIL during key on, engine off, the following prompt directs the inspector tot turn the key back to the "OFF" position:

RETURN TO KEY OFF POSITION

The analyzer 10 then instructs the inspector to press the "continue" key to continue. As part of the OBD II test, the vehicle must be shut down for at least 12 seconds before returning to the key-on/engine-running position. During this 12-second delay, the inspector may be prompted to hook-up the analyzer 10 to the vehicle's J1978 OBD connector.

Figure 3:
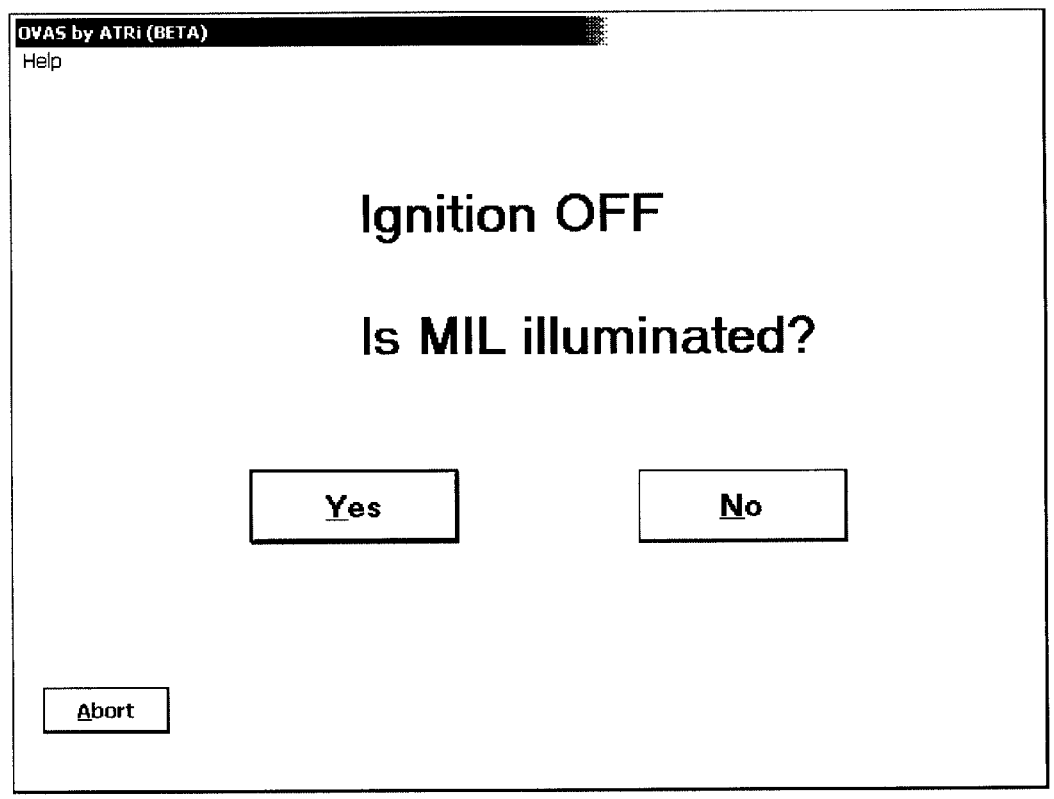
Figure 4:
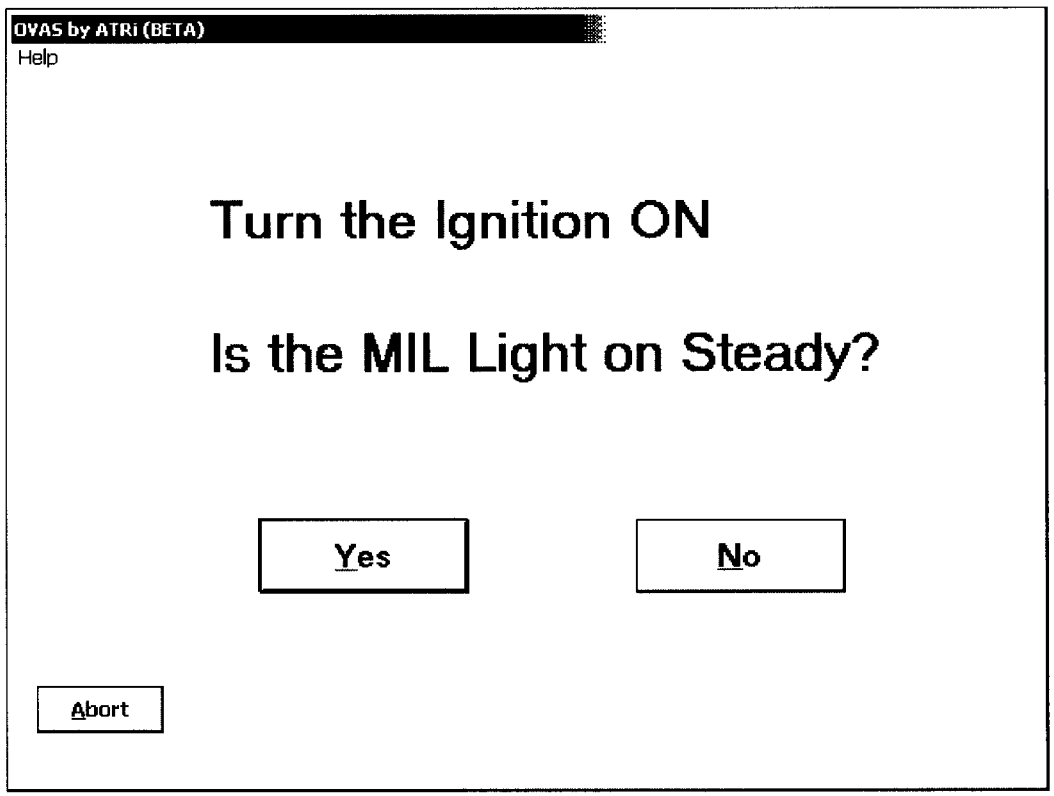
Figure 5:
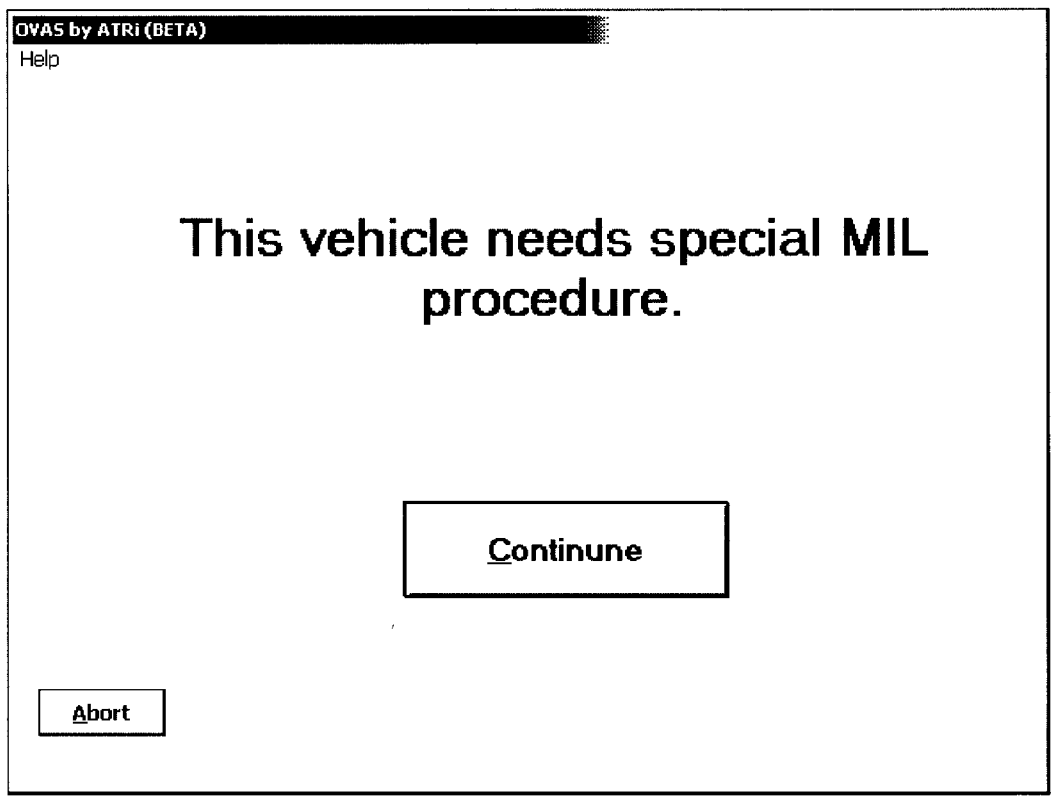
Figure 6:
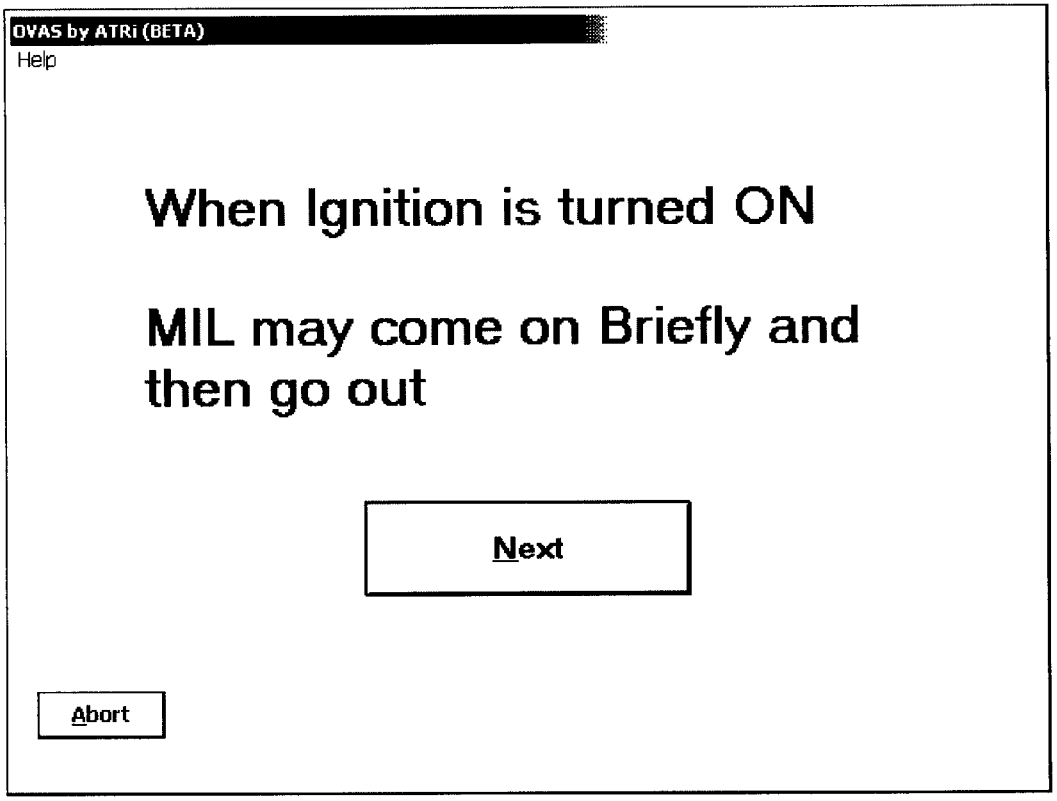
Figure 7:
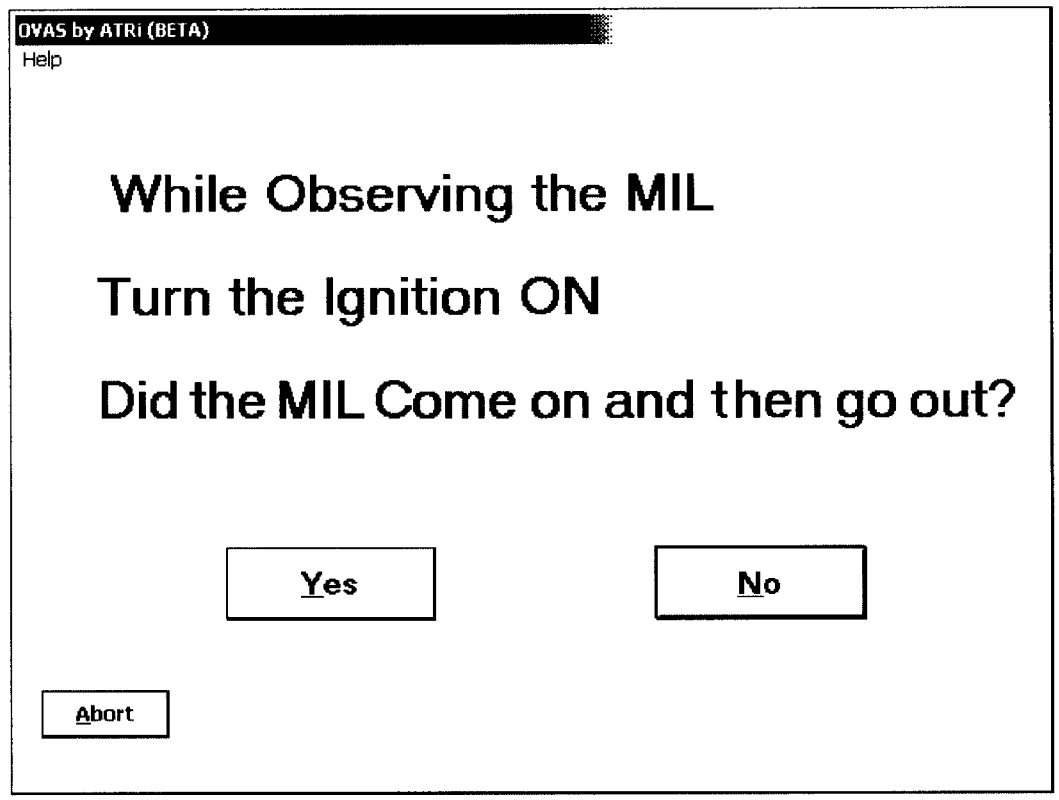

An alternative integration of KOEO prompts with programming criteria is illustrated in FIGS. 3–4 and FIGS. 5–7. FIGS. 3–4 demonstrate a KOEO test (in the case of an OBD II compliant vehicle), where the MIL illuminates so long as the key is turned to the KOEO position. FIGS. 5–7 demonstrate a KEOE test in the case of an OBD II non-compliant vehicle, where the MIL illuminates briefly and then goes out. In this example, it is envisioned that the inspector starts from the initial test screen in FIG. 1e and proceeds through the screens in FIGS. 2a–2l, and then conducts either the KOEO through FIGS. 3–4 or the KOEO through FIGS. 5–7. The analyzer 10 determines the correct sequence based on the particular vehicle being tested. In either case, a flag is set during the KOEO test sequence and the inspector proceeds to the screen shown in FIG. 8 at the end of the KOEO test sequence.

Figure 8:
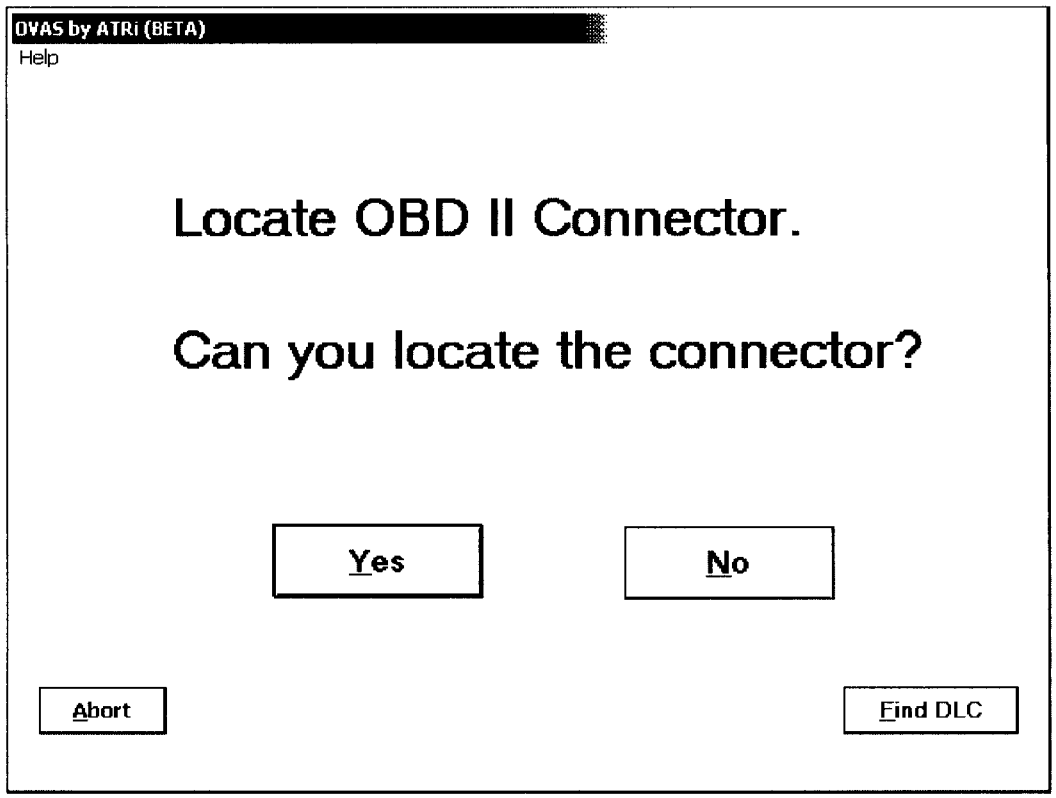
Figure 9:
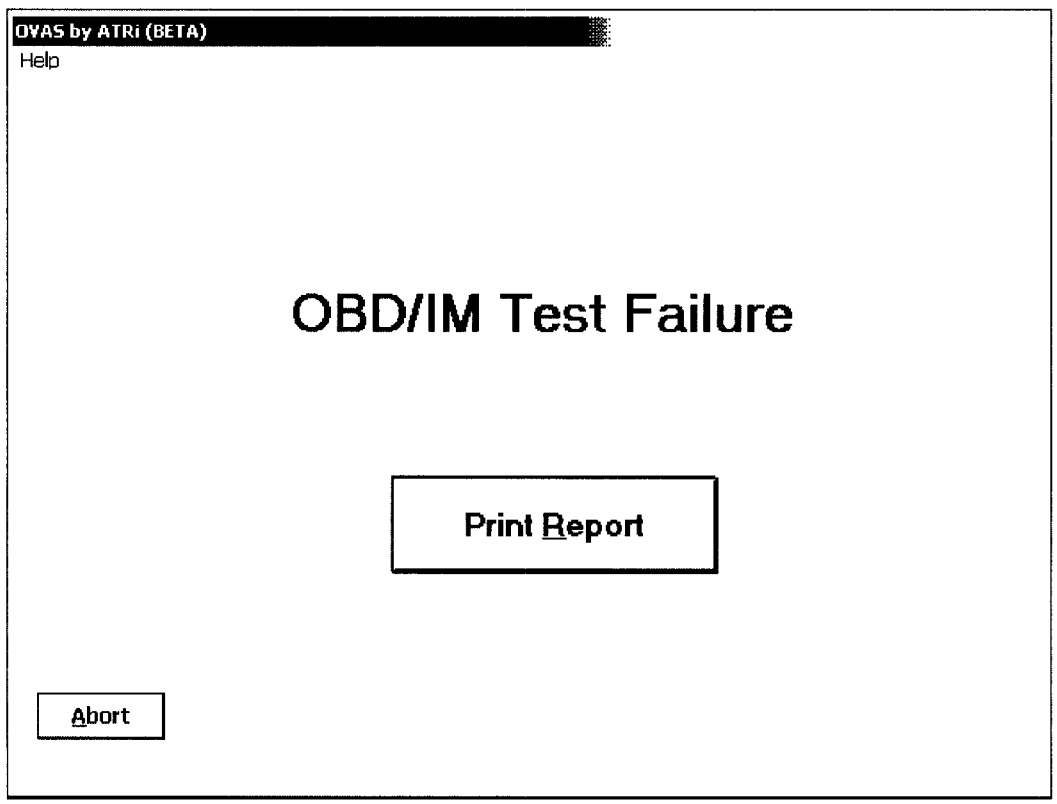
Figure 10:
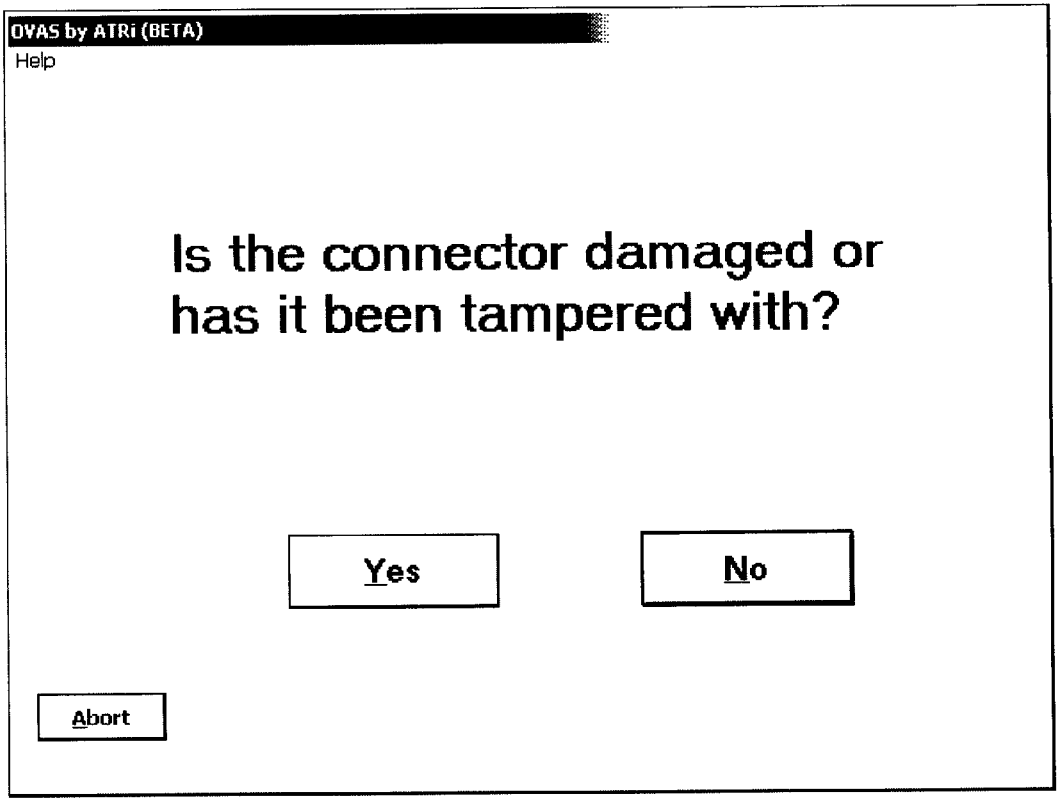

The screen in FIG. 8 prompts the inspector to locate the OBD II connector. If the inspector indicates that the connector is not present, then the failure screen shown in FIG. 9 is displayed and the test is finished. It is also contemplated that additional follow-up questions could be prompted, such as whether the connector has been removed. If the connector is present, however, the screen shown in FIG. 10 is displayed to prompt the inspector to determine if the connector is in working order. If not, the screen in FIG. 9 is displayed and the test is finished; otherwise, the screen illustrated in FIG. 11 prompts the inspector to connect the analyzer 10 to the data link connector.

The analyzer 10 is preferably equipped with a standard SAE J1978 OBD connector and communications link to allow readiness codes, fault codes, Malfunction Indicator Light (MIL) status, VIN number (when available), PID count and PCM-ID to be downloaded thereto from the on-board computer for applicable vehicles. In addition, the equipment design and operation meets all Federal requirements (contained in 40 CFR 85.2207-2231) and recommended SAE practices (e.g., J1962, J1978 and J1979) for OBD II system inspections.

Because the OBD II interrogation process is fully integrated with the analyzer 10, no inspector intervention is required for collecting and recording the OBD data retrieved via the OBD diagnostic link. The OBD II readiness codes, failure codes, MIL status, VIN number (when available), PID count and PCM-ID are automatically retrieved through a standard interface and vehicle connector. Thus, no manually linked hand-held unit or separate interface is used.

Continuing with the OBD inspection process, an alternative OBD II Connector Prompt sequence reads as follows:

LOCATE THE VEHICLE'S OBD DIAGNOSTIC LINK CONNECTOR. IS THE CONNECTOR MISSING OR DAMAGED? ENTER "YES" OR "NO"

CONNECT THE ANALYZER (e.g., analyzer 10) CONNECTOR TO THE VEHICLE OBD CONNECTOR AND SELECT "ANALYZE"

The analyzer 10 then prompts the inspector for an OBD II diagnostic link connection for all passenger vehicles and light-duty trucks whose model year is equal to or newer than the vehicle model year contained in the OBD_MODEL_YR field in QUETEST.DAT. The analyzer 10 is also designed to provide assistance to the inspector by providing OBD II connector locations through an OBD II connector location look-up table included within the OBD-VLT table, as stated previously.

Once a physical connection is established, the OBD II Readiness Evaluation, Malfunction Indicator Light (MIL) Status, and Diagnostic Trouble Code (DTC) Check may be performed, beginning with an exemplary Start Engine Prompt:

START ENGINE. PRESS CONTINUE.

Then, a Mode $01, PID $01 request (i.e., for current powertrain diagnostic data in accordance with SAE J1979 requirements) is transmitted to the on-board computer to determine the evaluation status of the OBD system, the number of emission-related trouble codes stored in memory, and the Malfunction Indicator Light (MIL) status. In addition, the system downloads and stores PID count and PCM-ID.

If, after 10 seconds, no response is received from OBD computer as a result of the Mode $01, PID $01 request, the analyzer 10 displays the following prompt:

THE OBD II CONNECTION CANNOT BE CONFIRMED—DO YOU WANT TO TRY AGAIN? PRESS "Y" FOR YES OR "N" FOR NO.

If "Y" is selected, the following prompt is given:

SWITCH THE IGNITION KEY OFF. REMOVE AND RECONNECT OBD II PORT TO DLC. RESTART ENGINE AND PRESS "CONTINUE" TO TRY TO ESTABLISH COMMUNICATION WITH THE ANALYZER.

The analyzer 10 may require the technician to "Try Again" one time. However, if after the second attempt no response is received from the OBD computer to the Mode $01, RID $01 request, then the following actions are taken by the system:

an "N" is written to the OBD_RESULT field in VEHICLE.DAT;

an "F" is written to the OVERALL_TEST_RESULT in EMISSION_RESULT.DAT, if TEST_DATE≧OBD_FAIL_START_DATE;

a "FAIL" is printed on both the OBD portion and the OVERALL TEST RESULT section of the Vehicle Inspection Receipt/Statement (VIR); and a message is printed on the Vehicle Inspection Receipt Statement (VIR) indicating that the vehicle's on-board diagnostic system did not respond to the request for data.

Assuming, however, the OBD computer responds to the initial request, the analyzer 10 then specifically determines which on-board monitors are supported by the OBD system, as well as and the readiness code status of each applicable monitors. The various monitors include the following:

(1) Misfire (continuous)
(2) Fuel system (continuous)
(3) Comprehensive component (continuous)
(4) Catalyst (once/trip)
(5) Heated catalyst (once/trip)
(6) Evaporative system (once/trip)
(7) Secondary air system (once/trip)
(8) Air conditioning system (once/trip)
(9) Oxygen sensor (once/trip)
(10) Oxygen sensor heater (once/trip)
(11) EGR system (once/trip)

For each monitor, the possible readiness code responses include: completed, not completed, or not supported/not enabled. A response that a monitor is not supported or not enabled means that, for that particular vehicle, that monitor is not applicable. Thus, when a "not supported/not enable" response is given, the analyzer 10 does not "fail" the vehicle for detecting such a code.

Each readiness code value is written to the appropriate test record fields in VEHICLE.DAT for each inspection using the following format:

Not supported/not enabled=0;

Completed=1; and

Not completed=2.

The analyzer 10 then evaluates the MIL status based on the data returned via the OBD link from the vehicle's OBD computer. The Yes/No (Y/N) status of whether the MIL has been commanded to be illuminated is recorded in the OBD MIL Status field of VEHICLE.DAT. If the MIL is commanded on, the analyzer 10 sends a Mode $03 request to the on-board computer to determine the number of stored OBD II related powertrain diagnostic trouble codes. The analyzer 10 retrieves the codes until the number of codes retrieved equals the number expected based on the initial Mode $01 response.

The analyzer 10 also counts the number of readiness monitors applicable to the vehicle being tested that have a value of true ("T") specified in QUETEST.DAT, but that do not have the appropriate readiness codes set (i.e., a value of "0" or "1" is not returned via the OBD link from the vehicle on-board diagnostic system). If (1) the number of "not ready" monitors exceeds the NO_OBD_NOT_RDY in QUETEST.DAT for the model year being tested, or (2) if the vehicle fails the KOEO test, or (3) if the MIL is commanded on, then:

an "F" is written to the OBD_RDY_RESULT, the OBD_FLT_RESULT, and the OBD_RESULT in VEHICLE.DAT, as well as to OVERALL_TEST_RESULT in EMISSION_RESULT.DAT, if TEST_DATE≧OBD_FAIL_START_DATE;

any DTCs found are written to OBD_FLT_CODES in VEHICLE.DAT;

a "FAIL" is printed in the OBD section of the VIR;

a "FAIL" is printed in the OVERALL TEST RESULT section of the VIR;

the VIR lists the specific DTCs, including an appropriate label of the code associated with the failure; and the analyzer 10 may proceed to further I/M testing, such as a visual catalytic coriverter check and gas cap test.

However, if the vehicle passes the KOEO test and if the MIL is not commanded on, then:

"Rejected" is printed in the OVERALL TEST RESULT section of the VIR;

an "F" is written to the OBDII READINESS RESULT and an "R" is written to the OBD II Result and Overall Test Result in OVAS.DAT; and a message is printed on the VIR stating that the vehicle was rejected because too many monitors were not ready. In addition, a message is printed on the VIR listing the "unset" readiness code(s) with an appropriate label of the code associated with the failure. The analyzer 10 may also print on the VIP a message recommending that the motorist contact MSOS (??) or the vehicle dealership for assistance with any OBD requirements or problems with the vehicle.

If the vehicle meets the readiness criteria but fails the KOEO test, or if the MIL is commanded on, then:

a "P" is written to the OBD_RDY_RESULT in VEHICLE.DAT;

an 'F' is written to the OBD_FLT_RESULT, OBD_RESULT in VEHICLE.DAT and to OVERALL_TEST_RESULT in EMISSION_RESULT.DAT if TEST DATE>OBD FAIL START DATE;

the DTC(s) found are written to OBD_FLT_CODES in VEH ICLE.DAT.

a "FAIL" is printed in the OBD section of the VIR, as well as in the OVERALL TEST RESULT section of the VIR;

the VIR lists the DTCs with an appropriate label of the code associated with the failure; and the analyzer 10 proceeds to further I/M testing, such as a visual catalytic converter check and gas cap test.

Finally, if the vehicle meets the readiness criteria, the MIL is not commanded on and the vehicle passes the MIL light check, then:

an "R" is written to both the OBD II Readiness Result OBD_FLT_RESULT and OBD_RESULT fields in VEHICLE.DAT;

a "PASS" is printed in the OBD section of the VIP; and the analyzer 10 prompts the inspector to proceed to further I/M testing, such as a visual catalytic converter check and gas cap test.

In addition to each of the recorded OBD II parameters discussed above, the analyzer 10 also downloads and records parameter identification (PID) count and PCM Module ID during each inspection.

Figure 11:
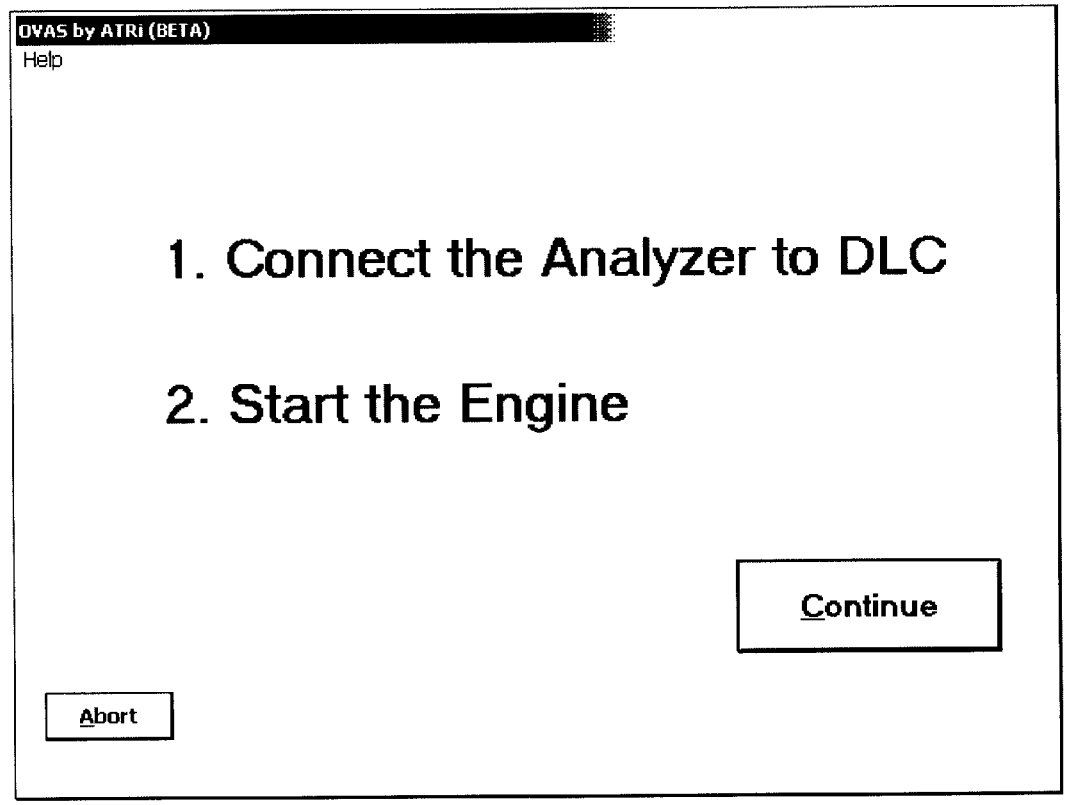
Figure 12:
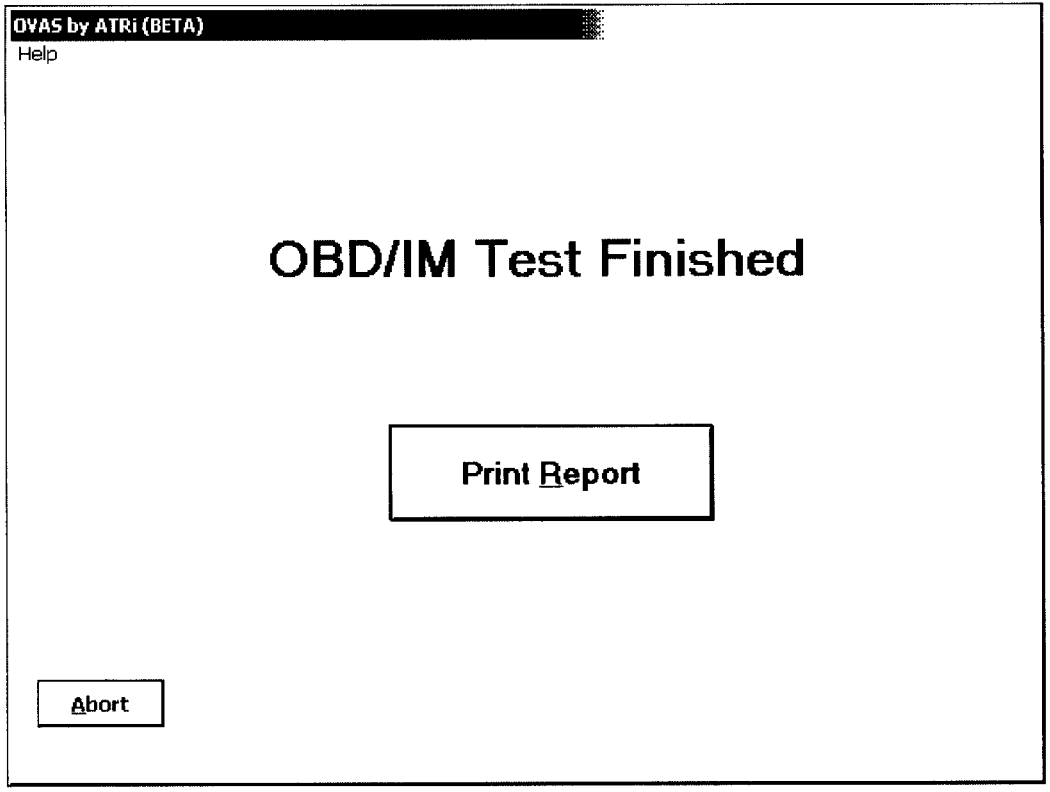
Figure 13:
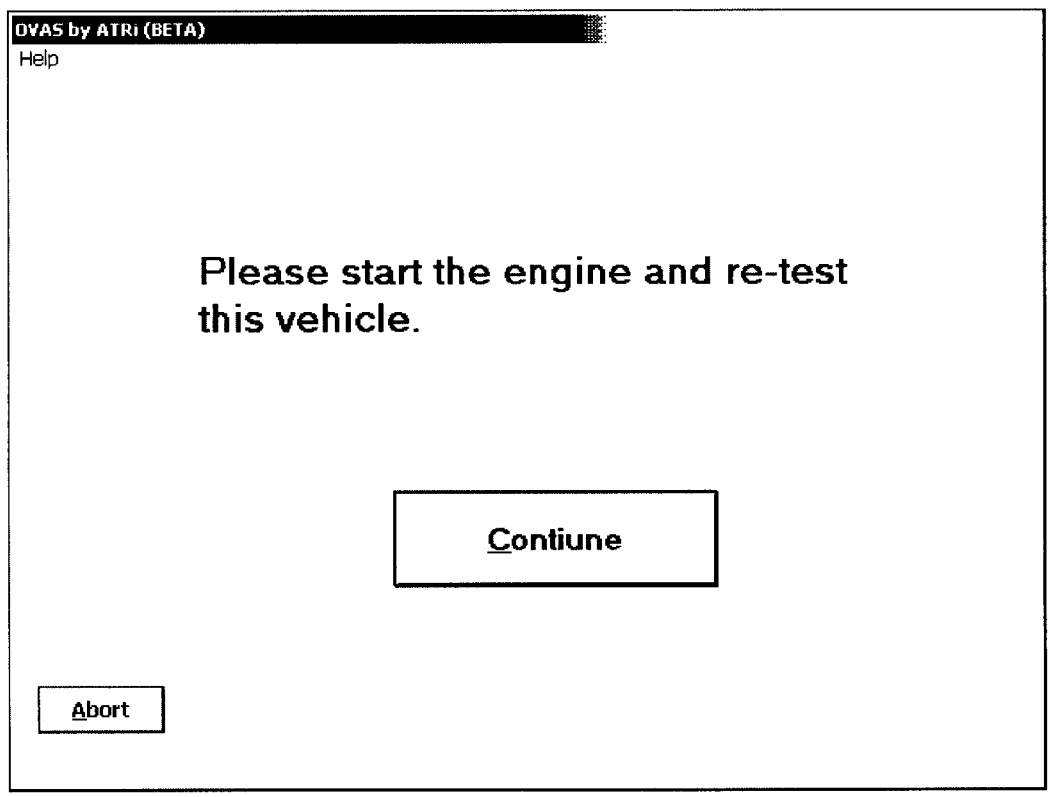
Figure 14:
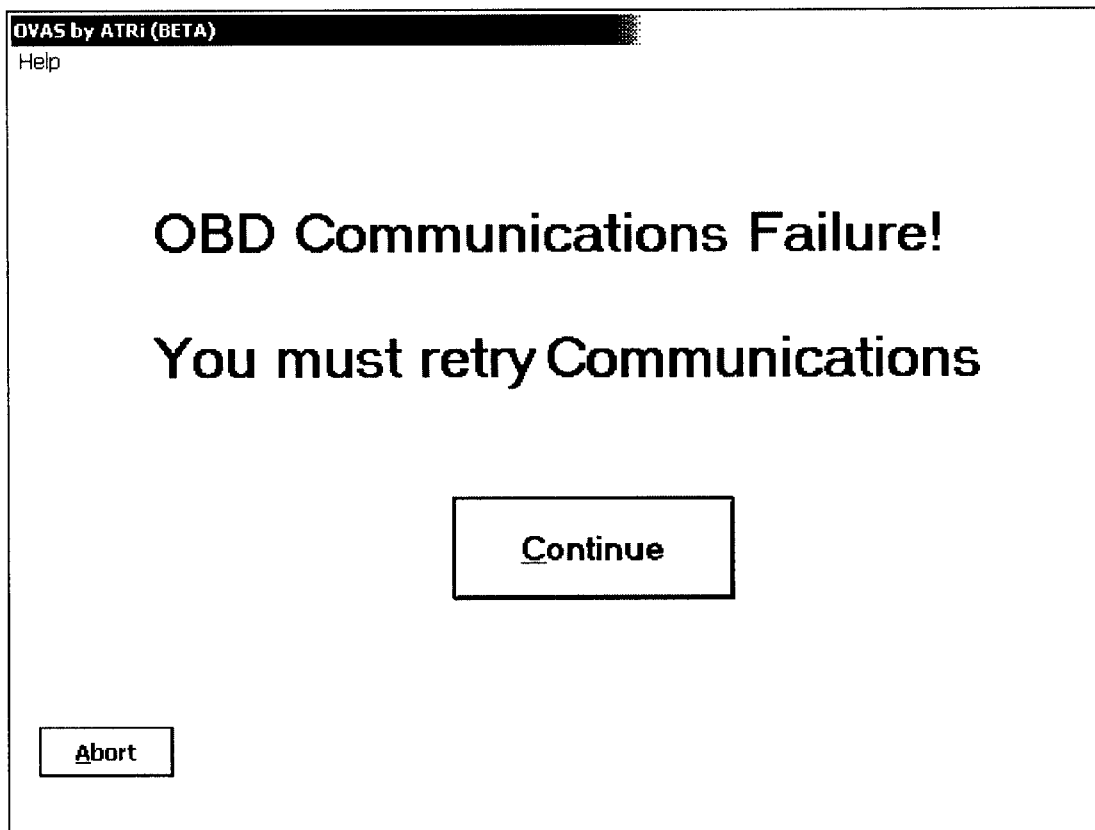
Figure 15:
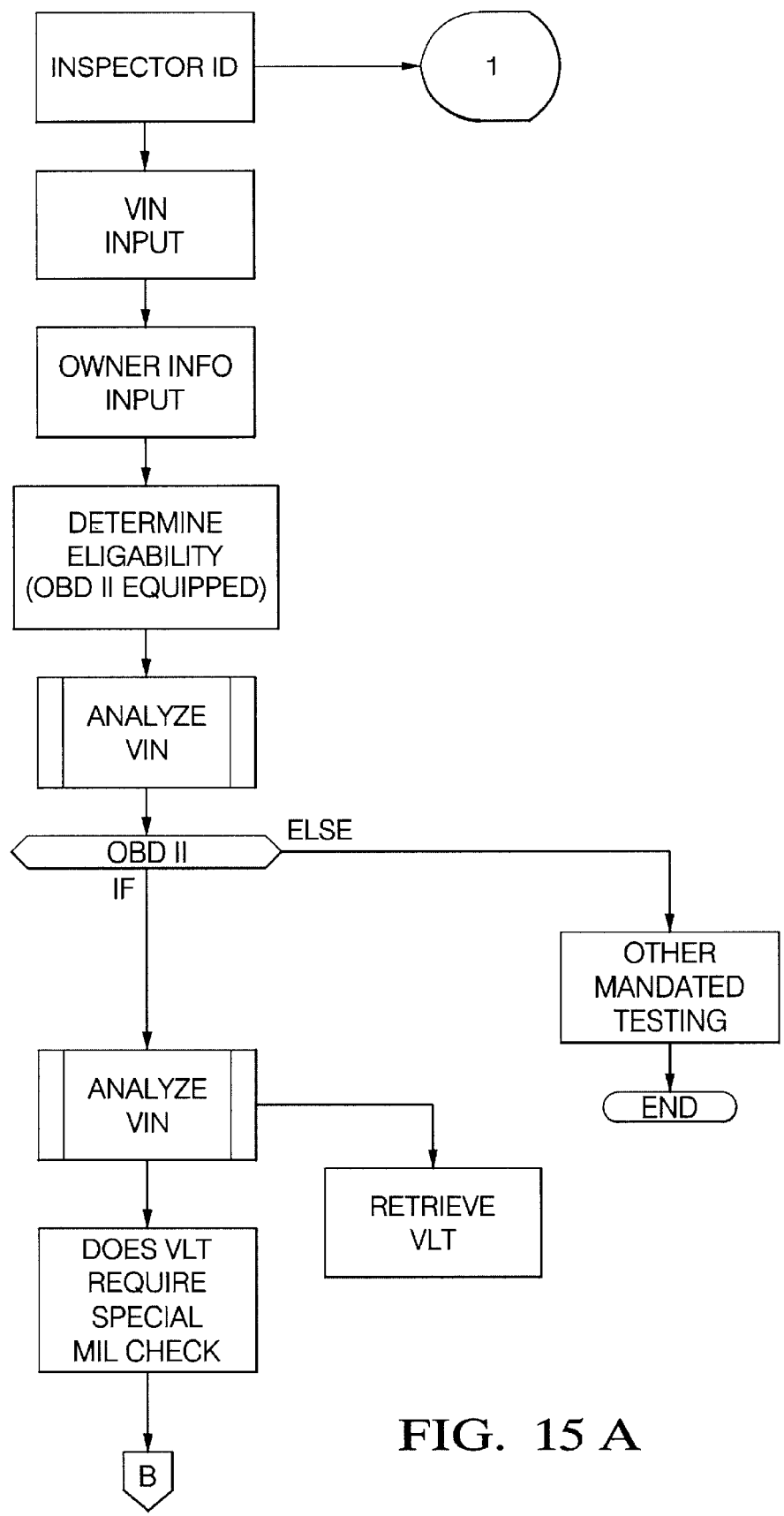
FIGS. 15a–e and FIGS. 16a–f depict flow diagrams illustrating a method for analyzing an OBD system.
Figure 15:
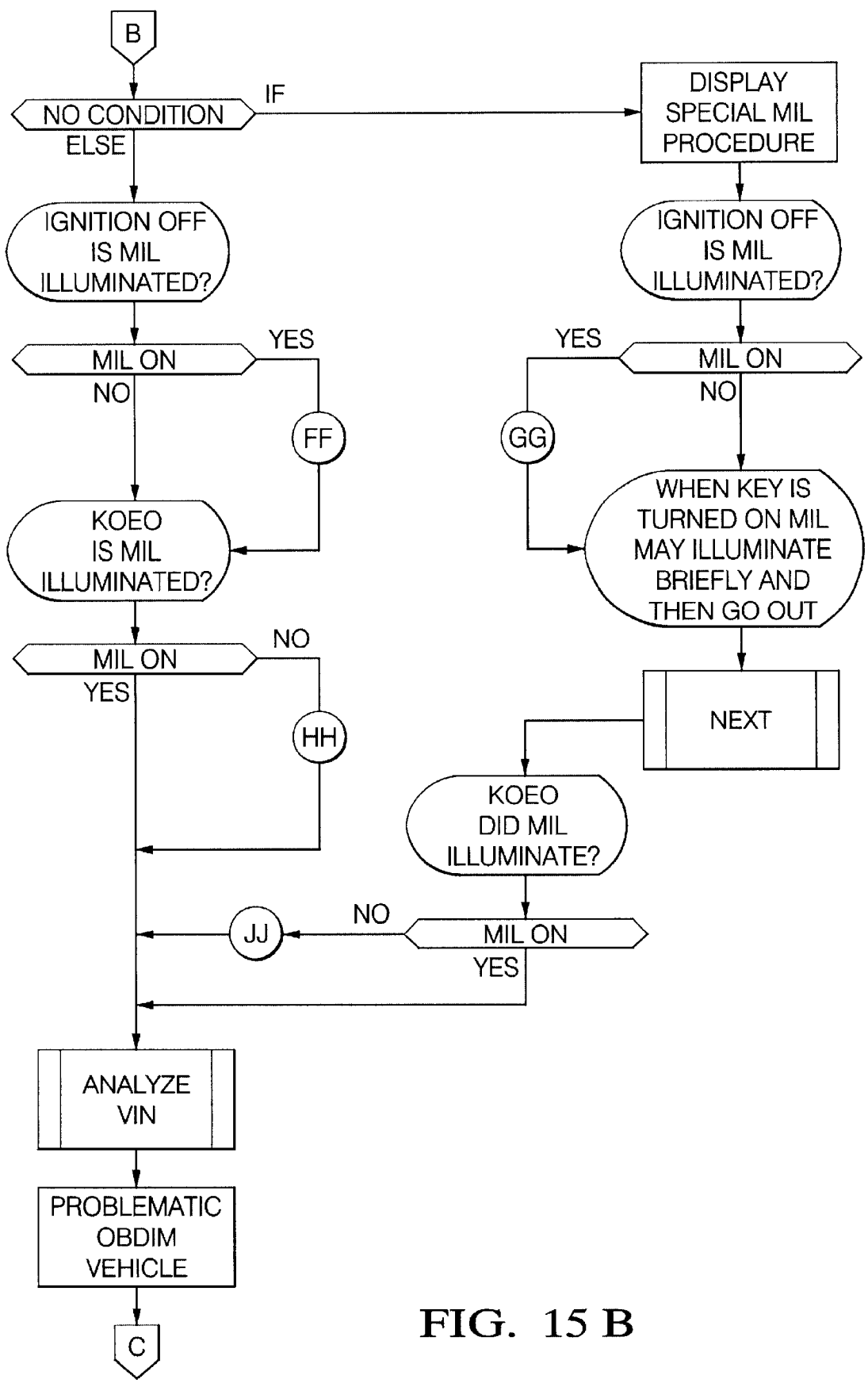
Figure 15:
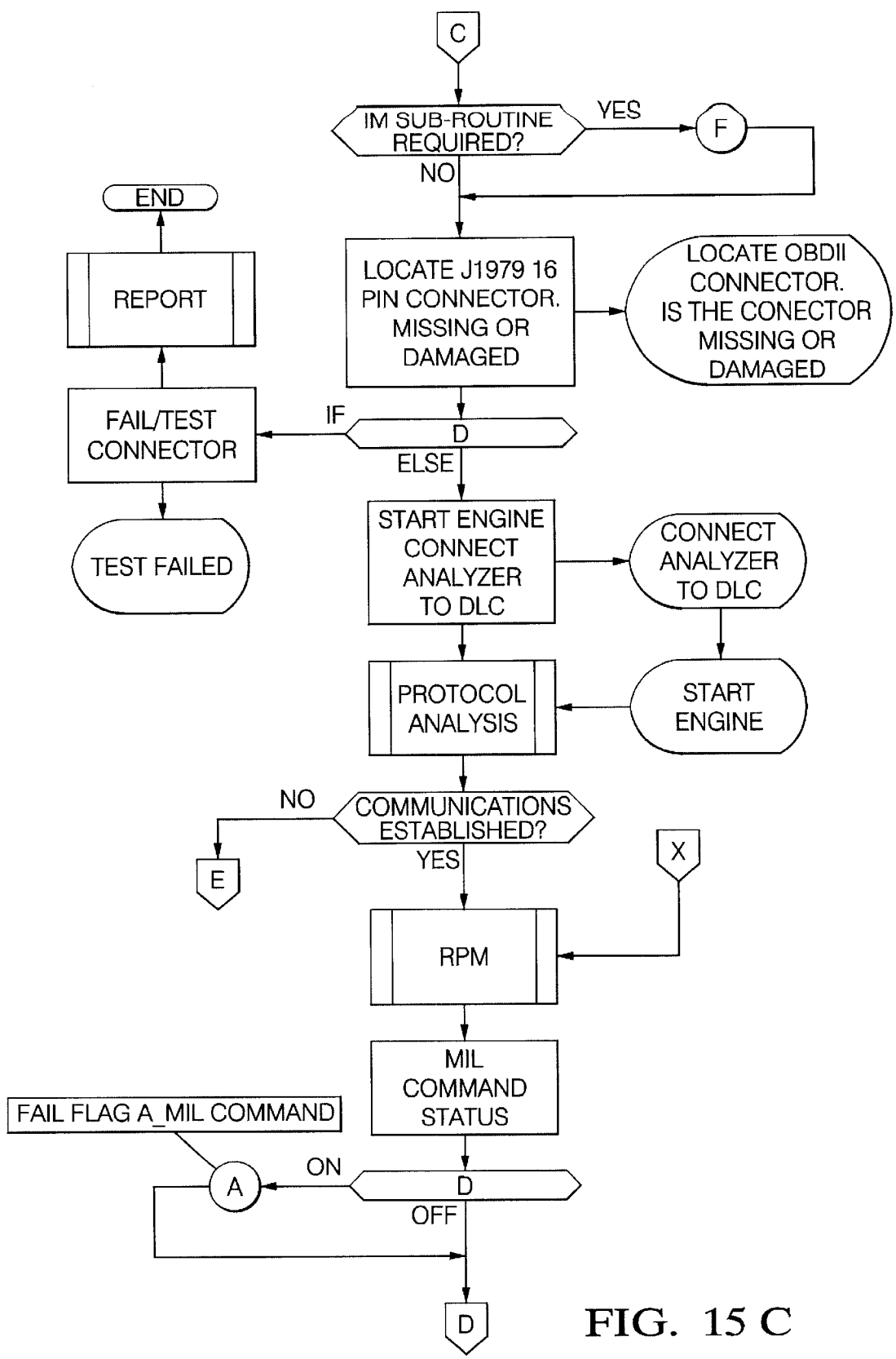
Figure 15:
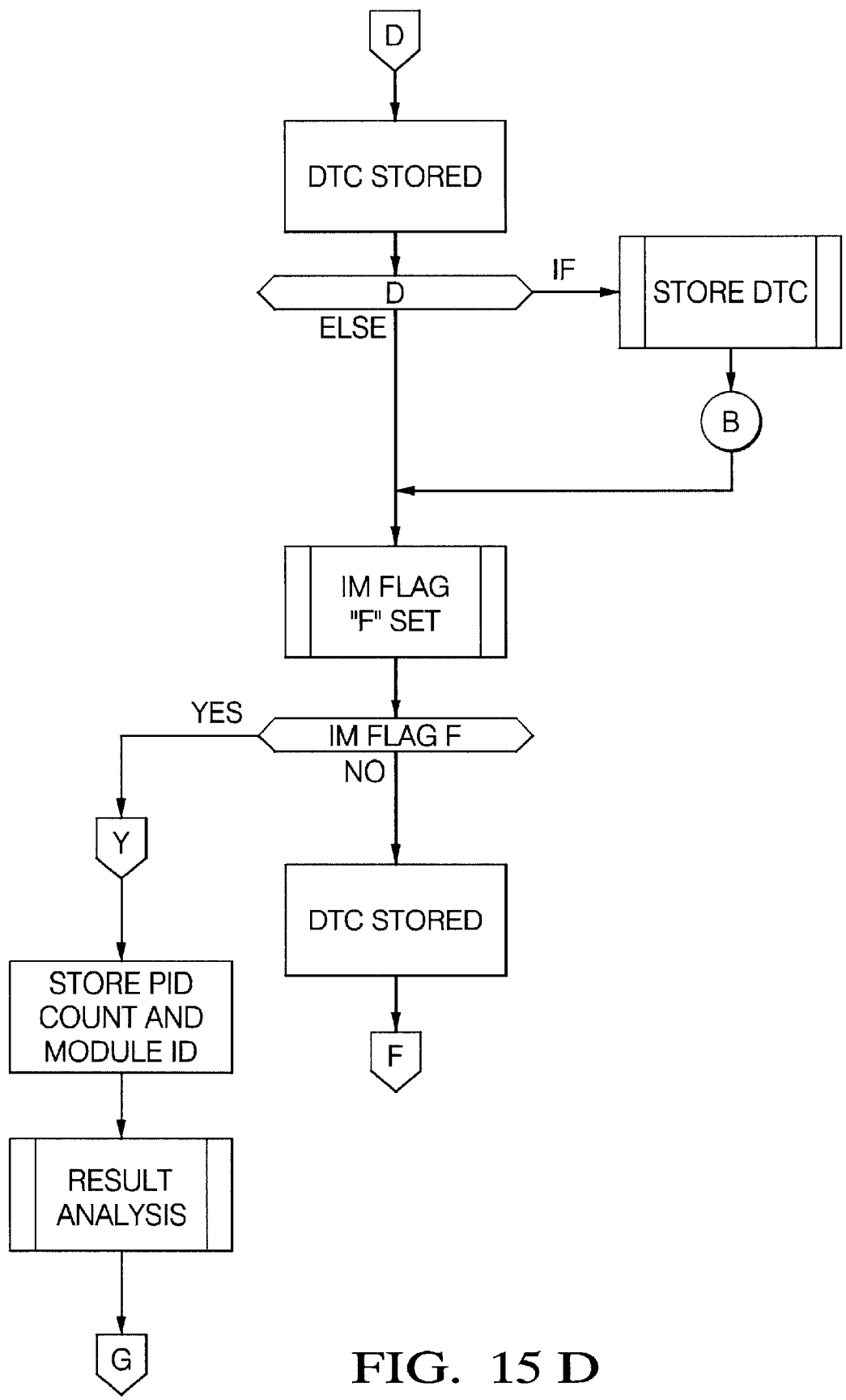
Figure 15:
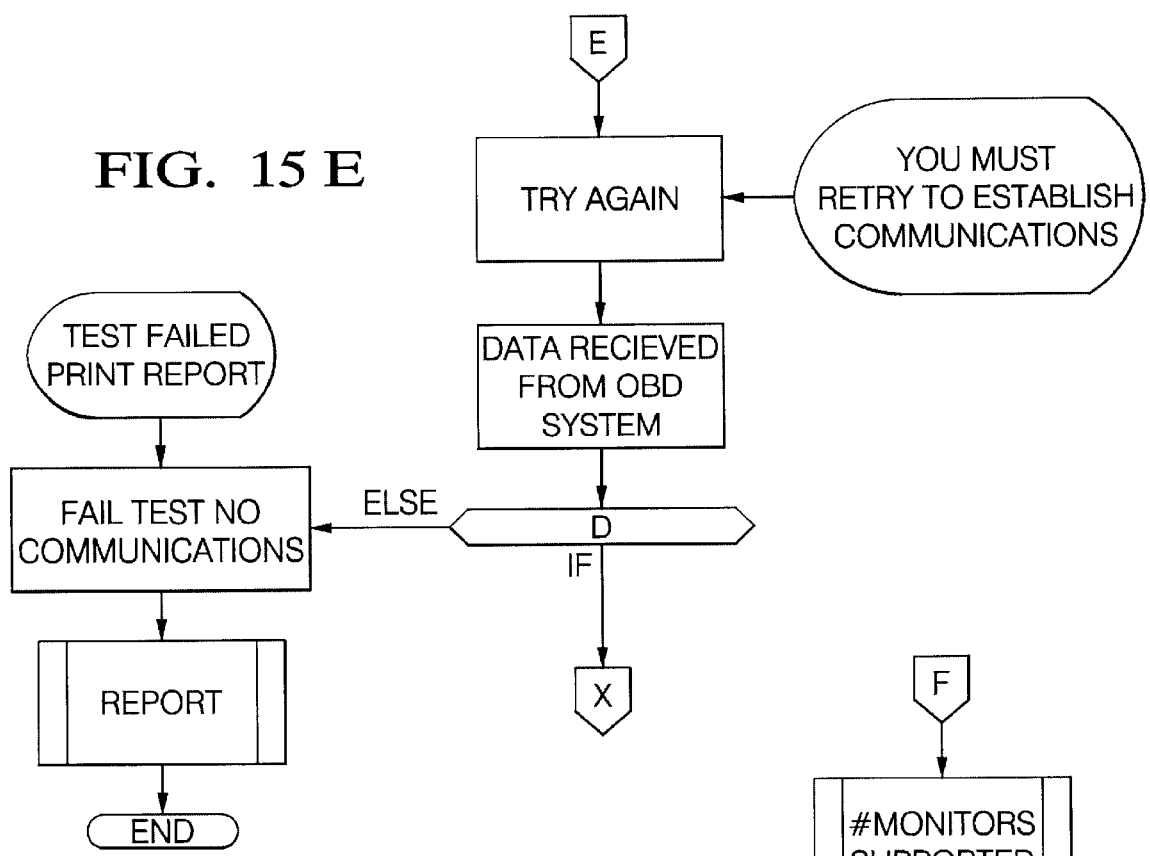
Figure 15:
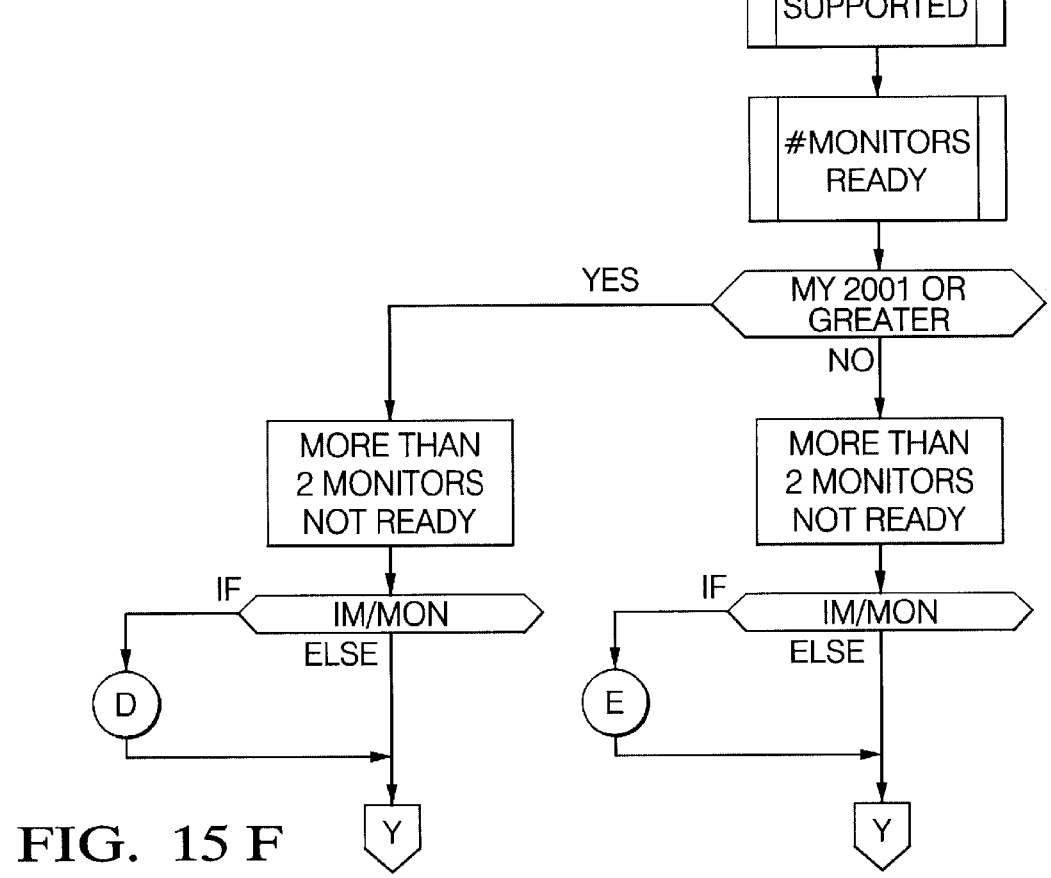
Figure 15:
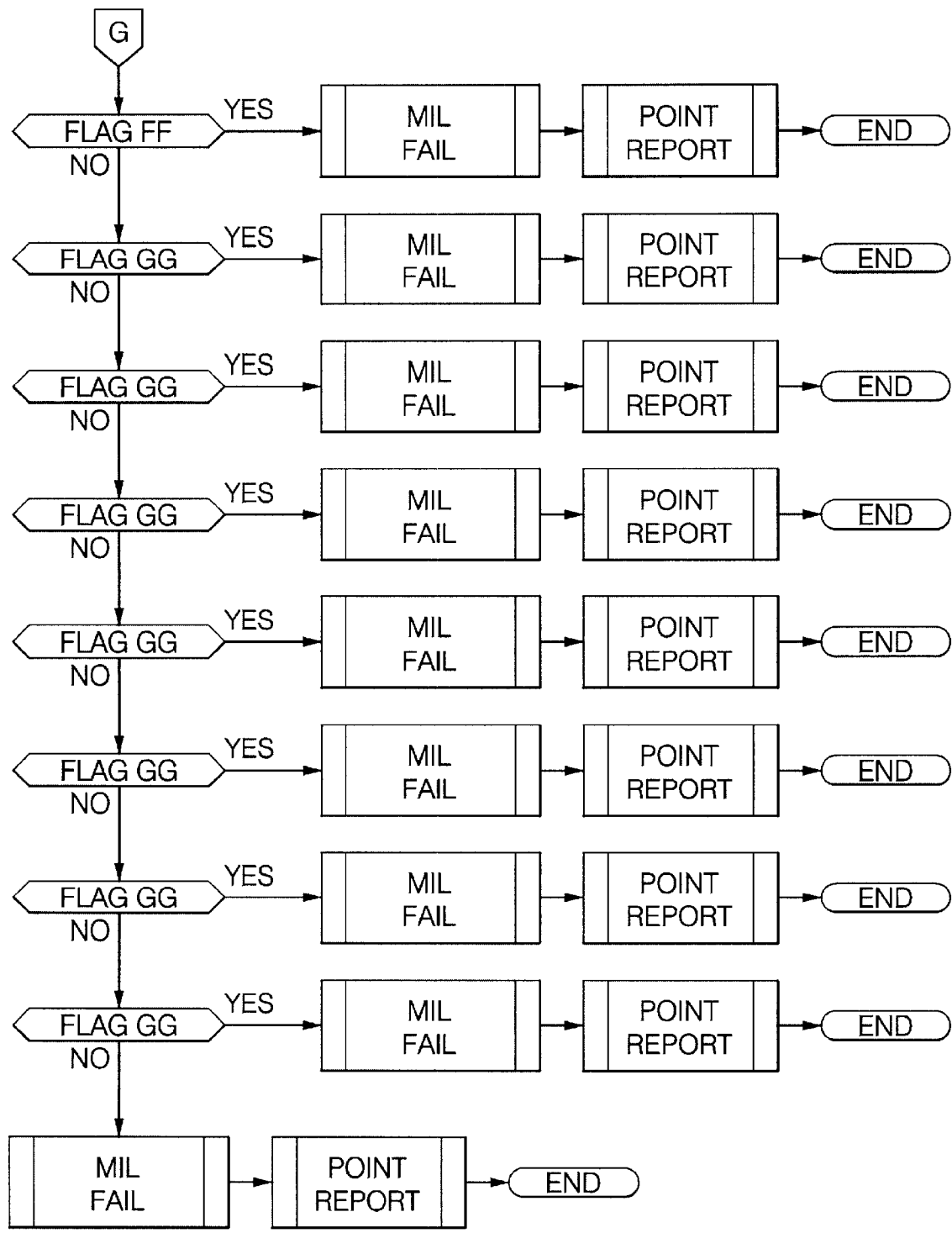
Figure 16:
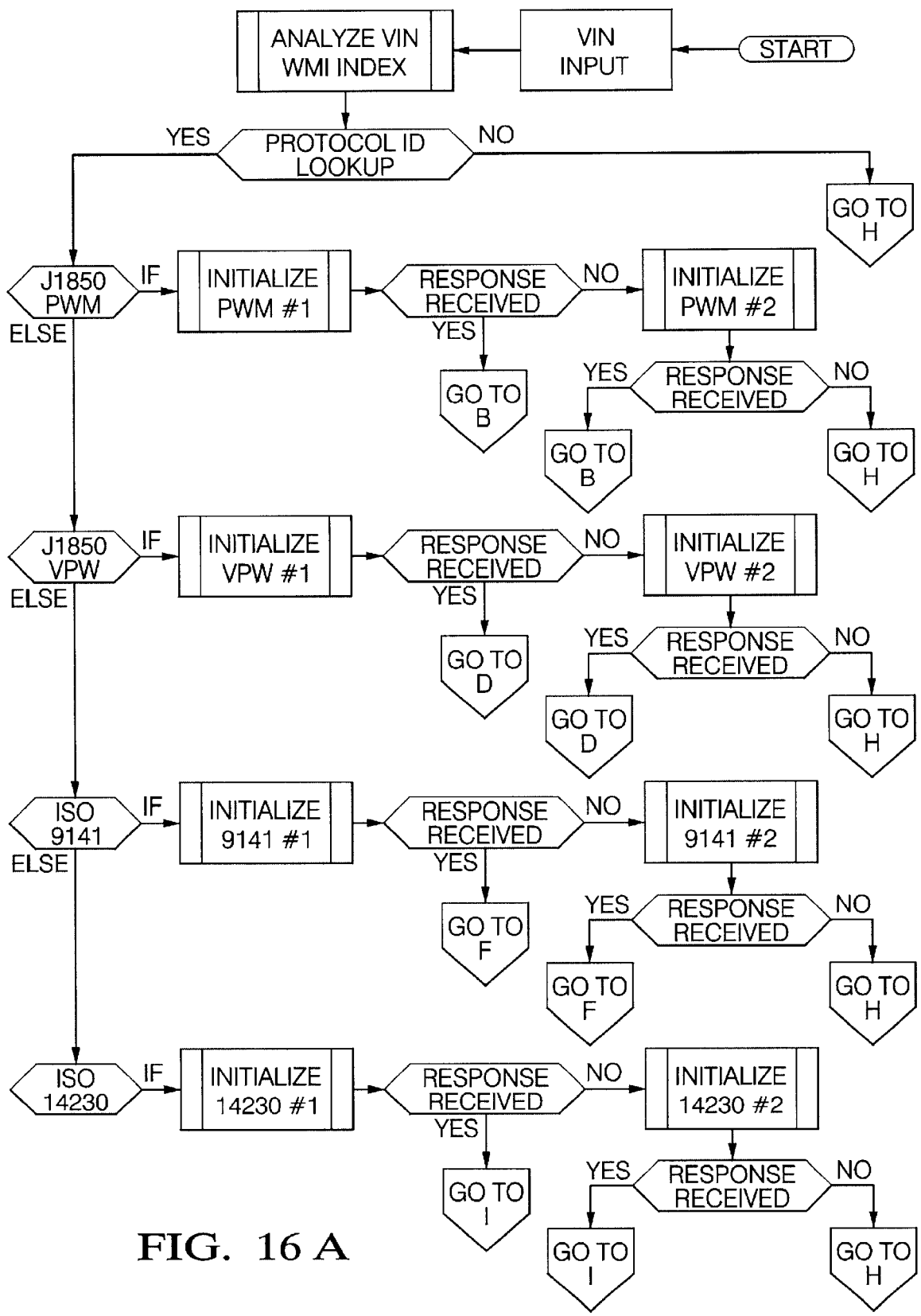
Figure 16:
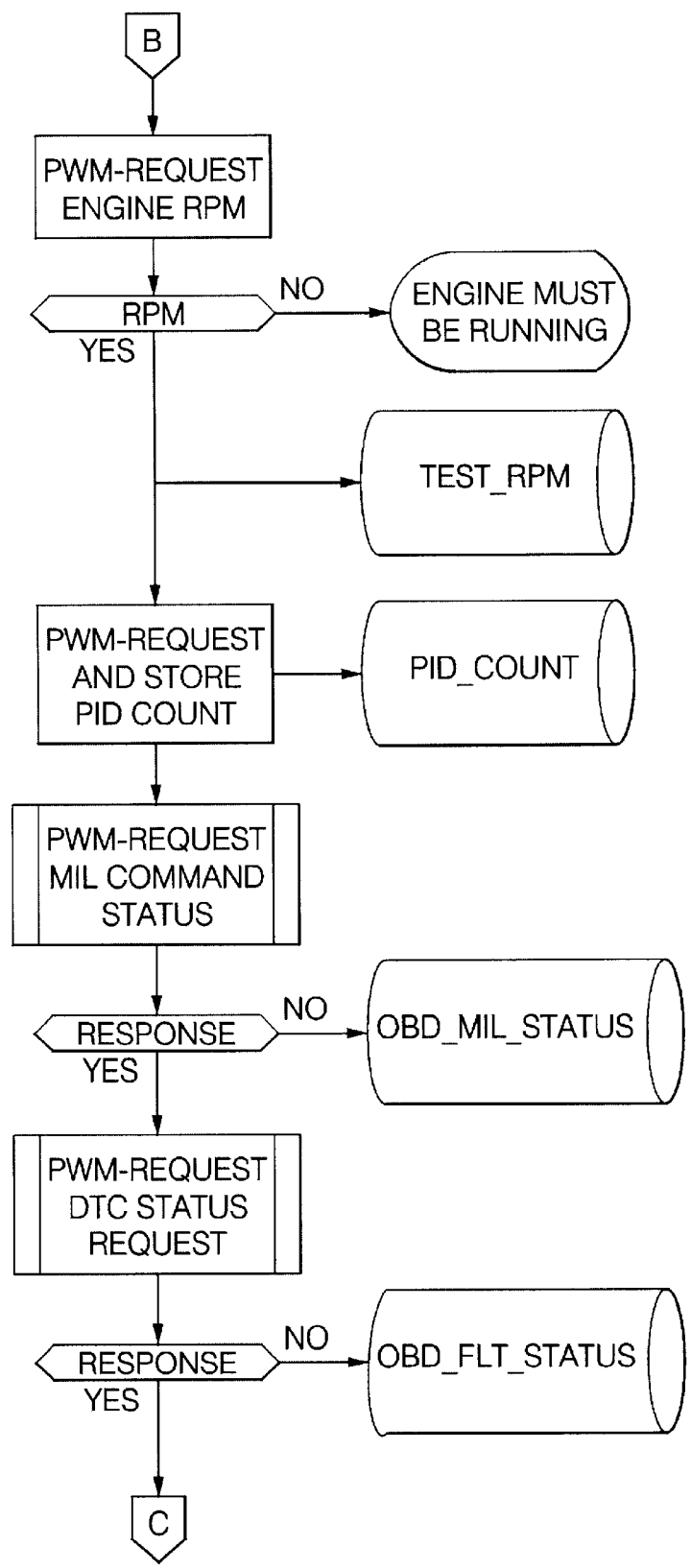
Figure 16:
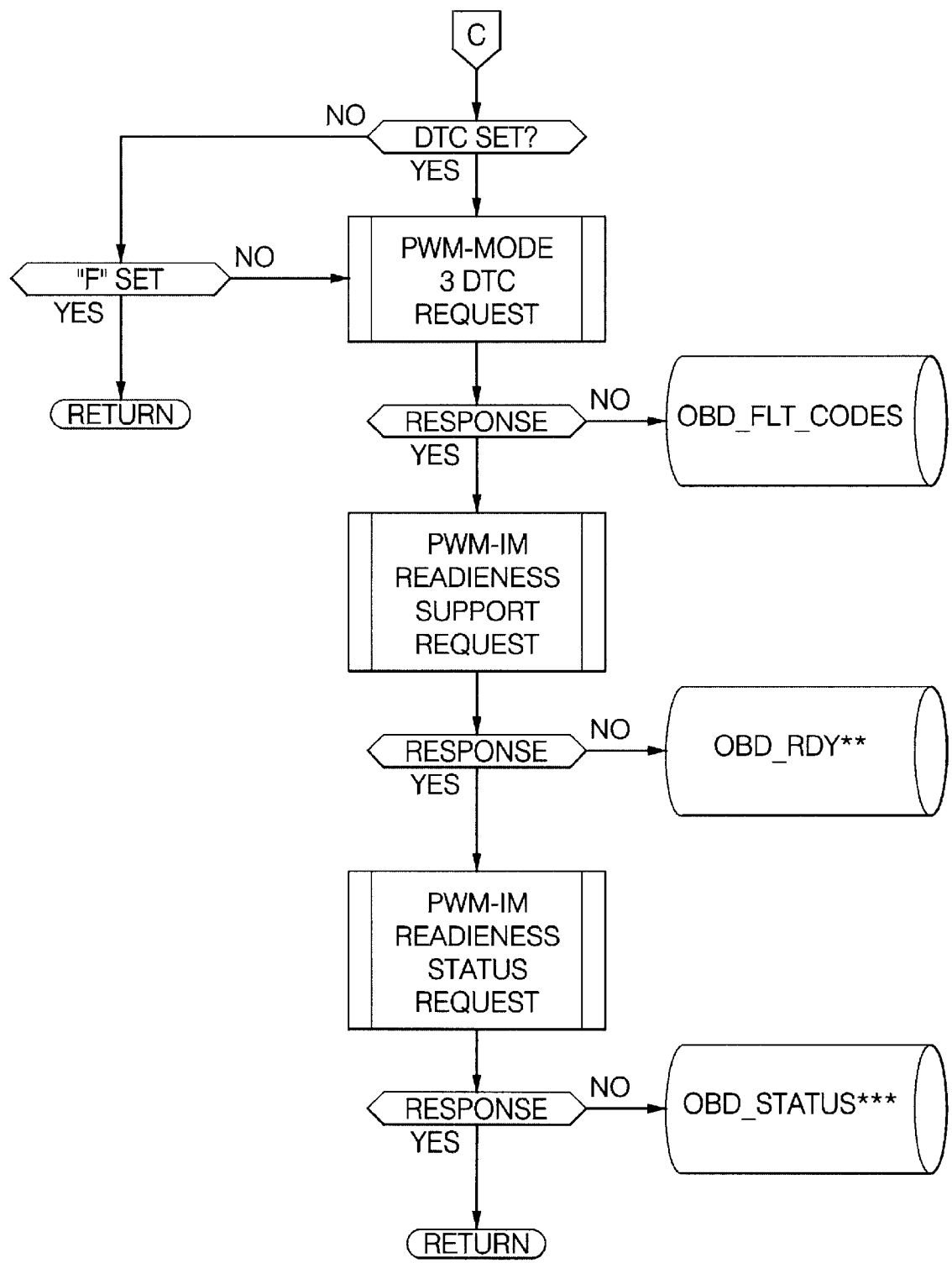
Figure 16:
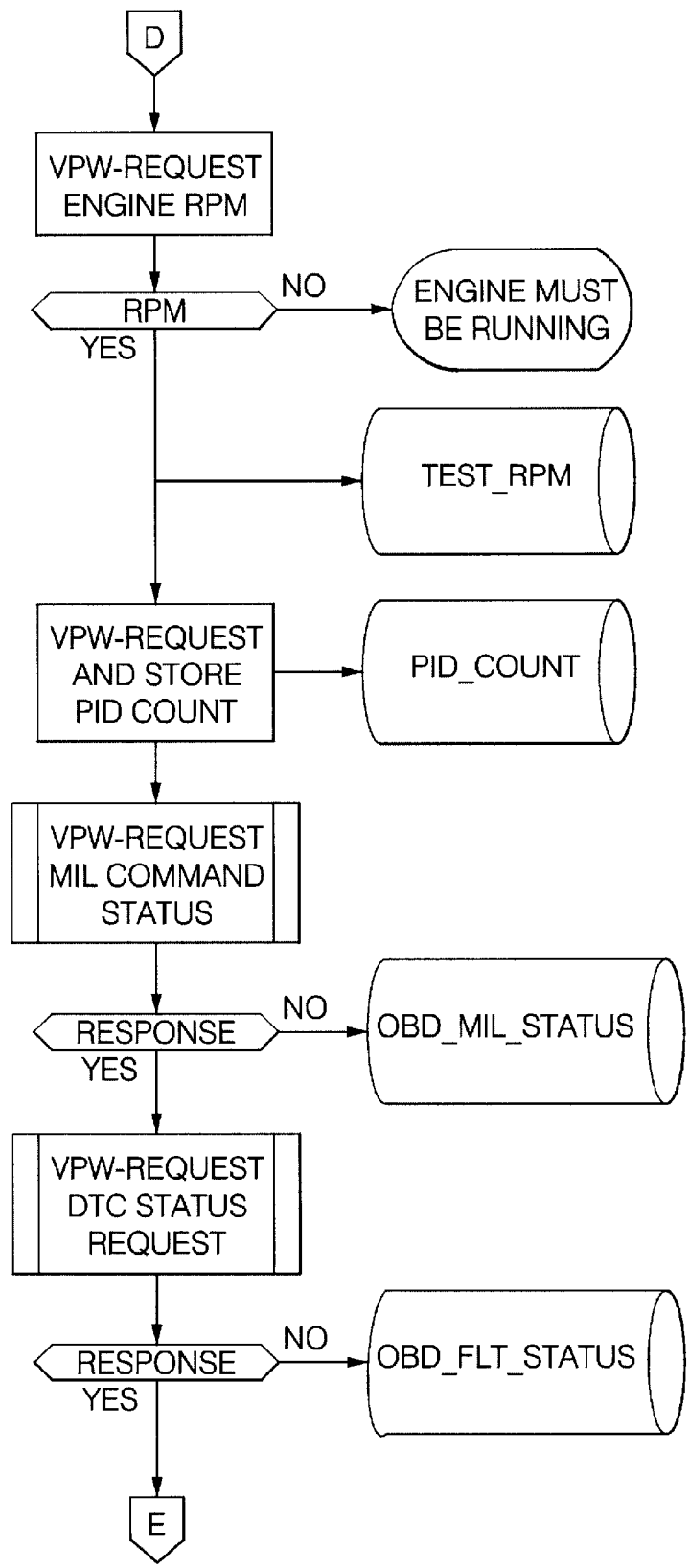
Figure 16:
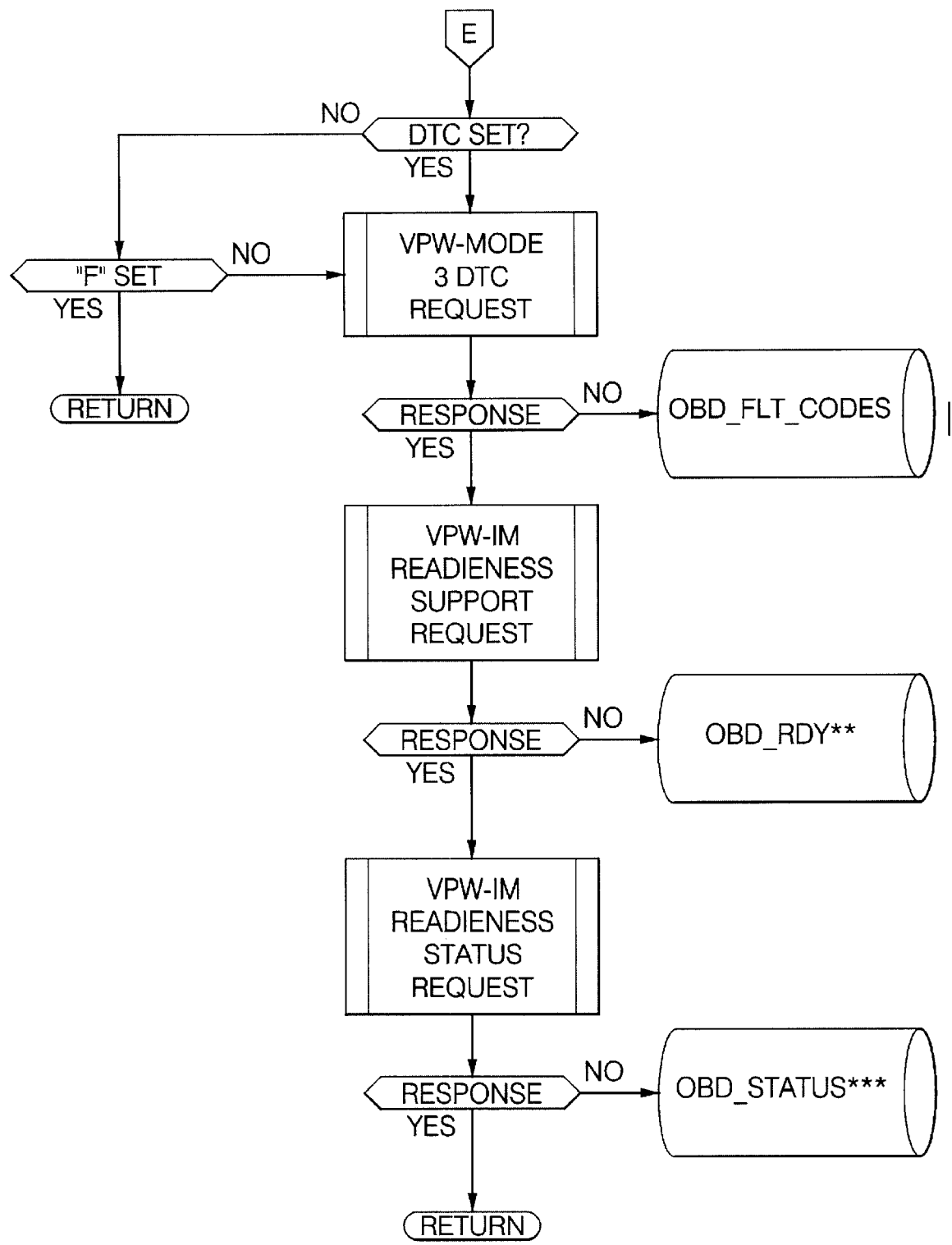
Figure 16:
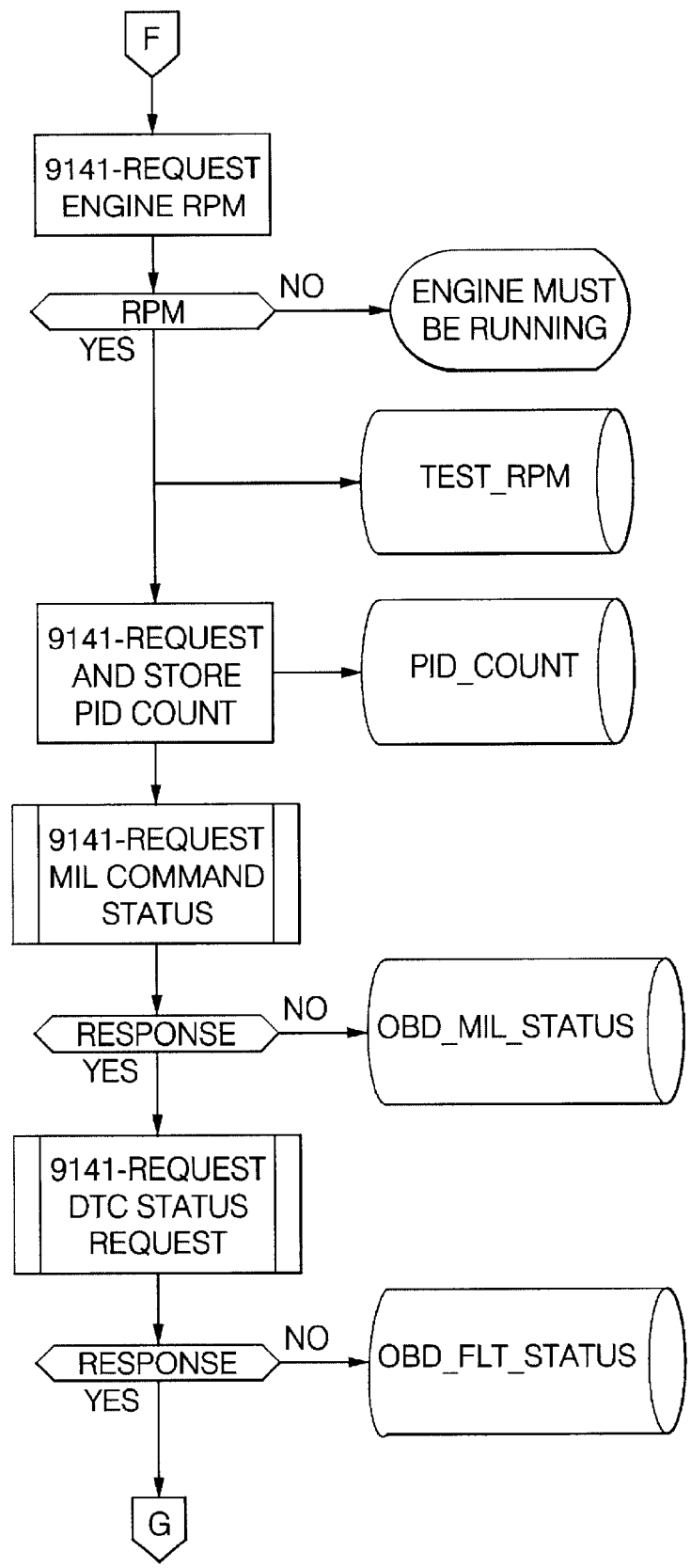
Figure 16:
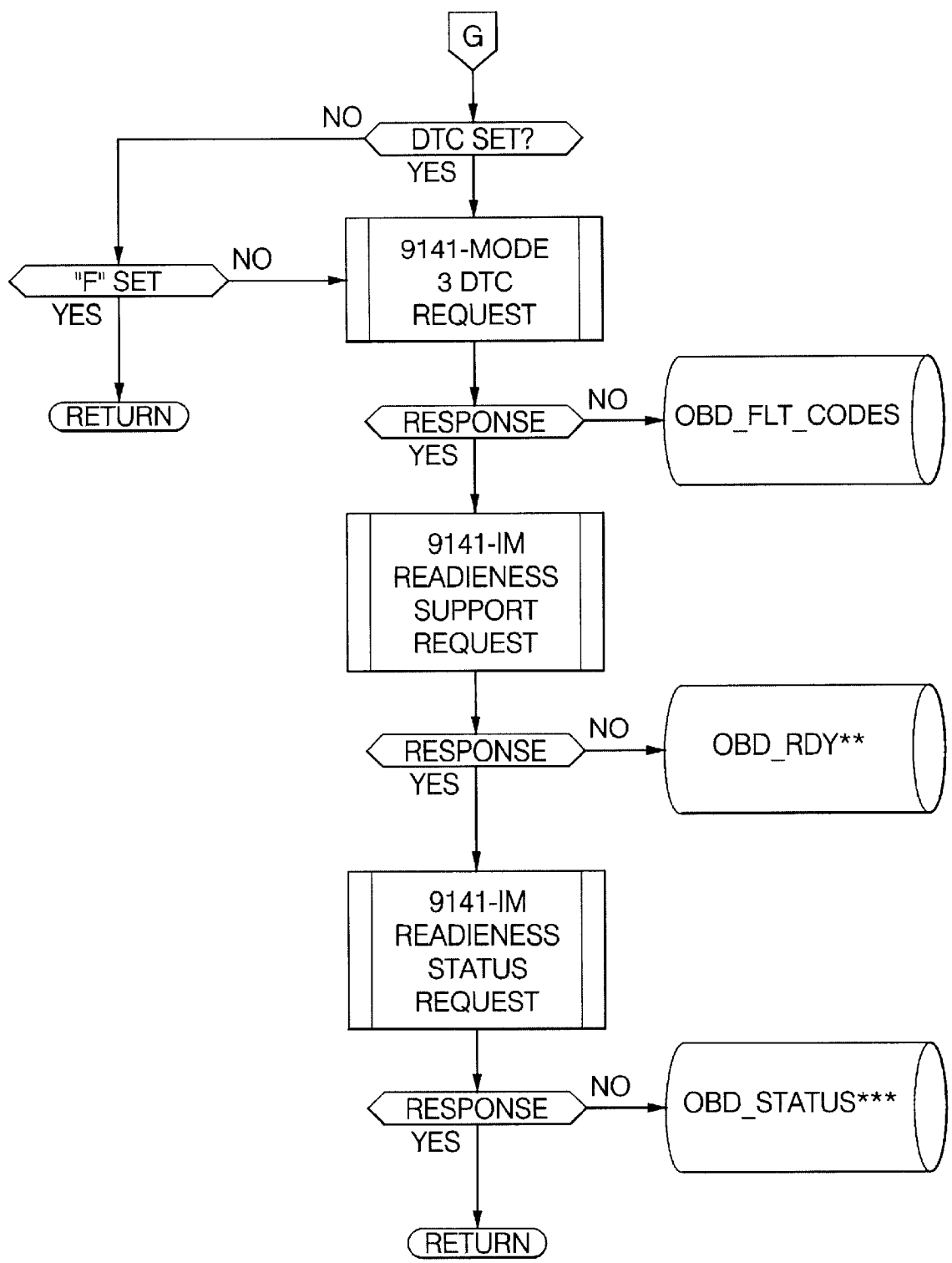
Figure 16:
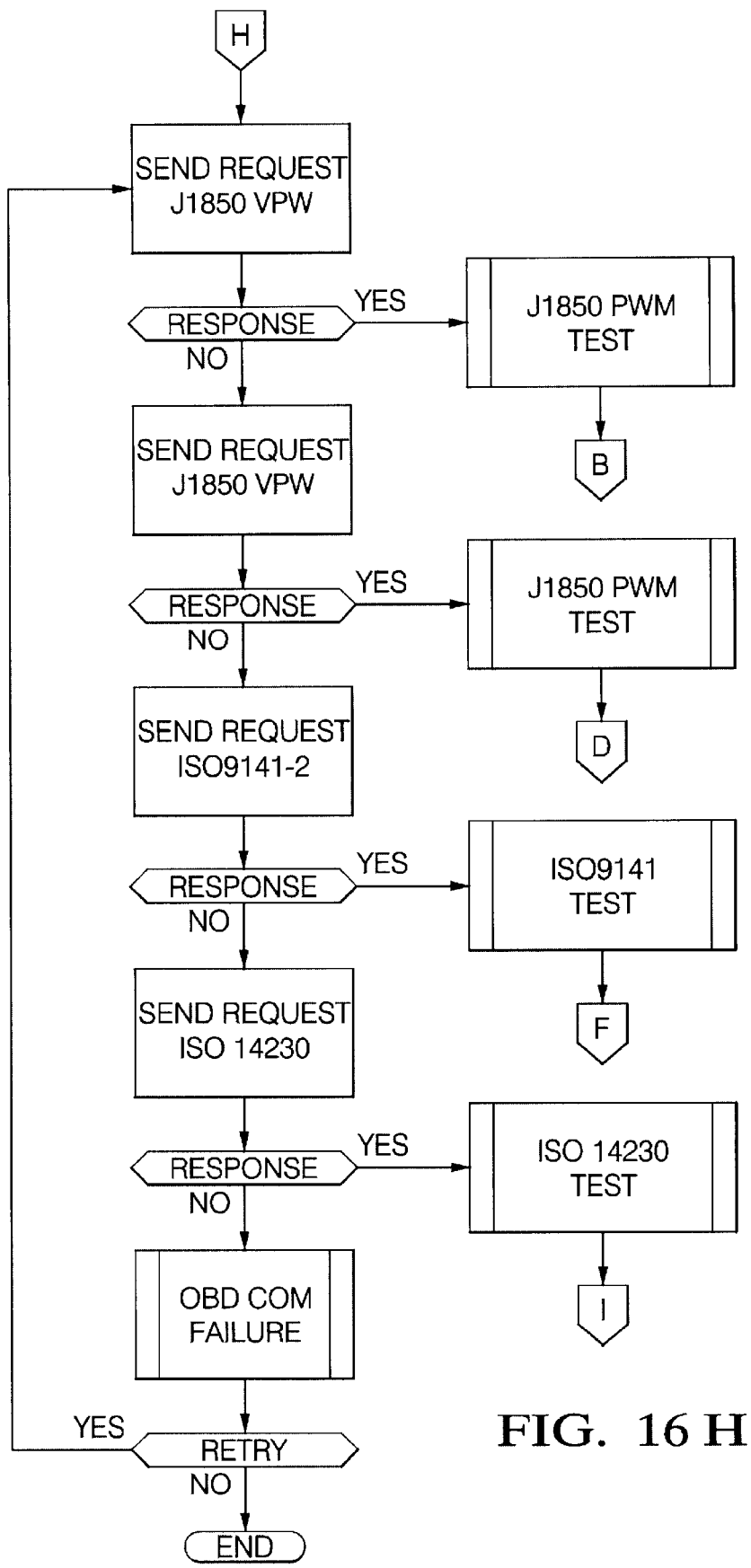
Figure 16:
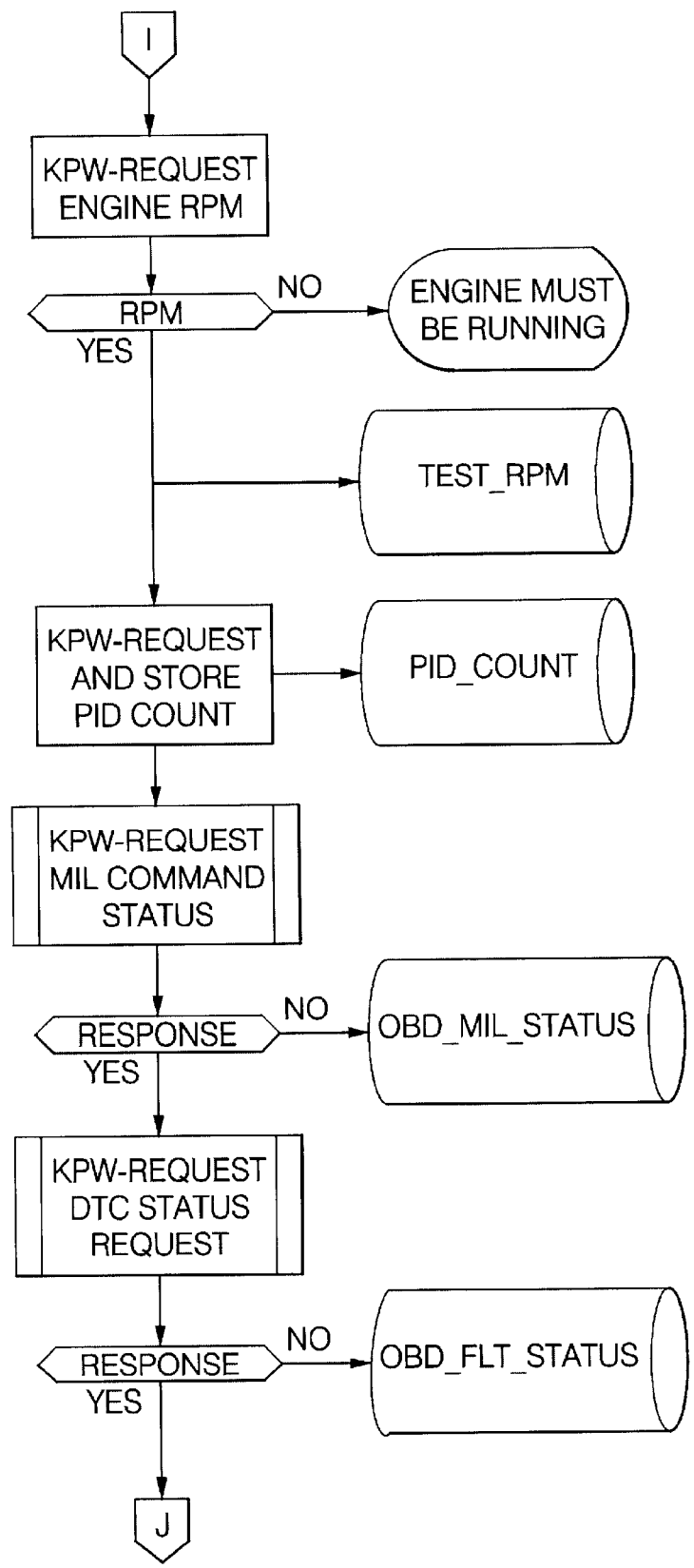
Figure 16:
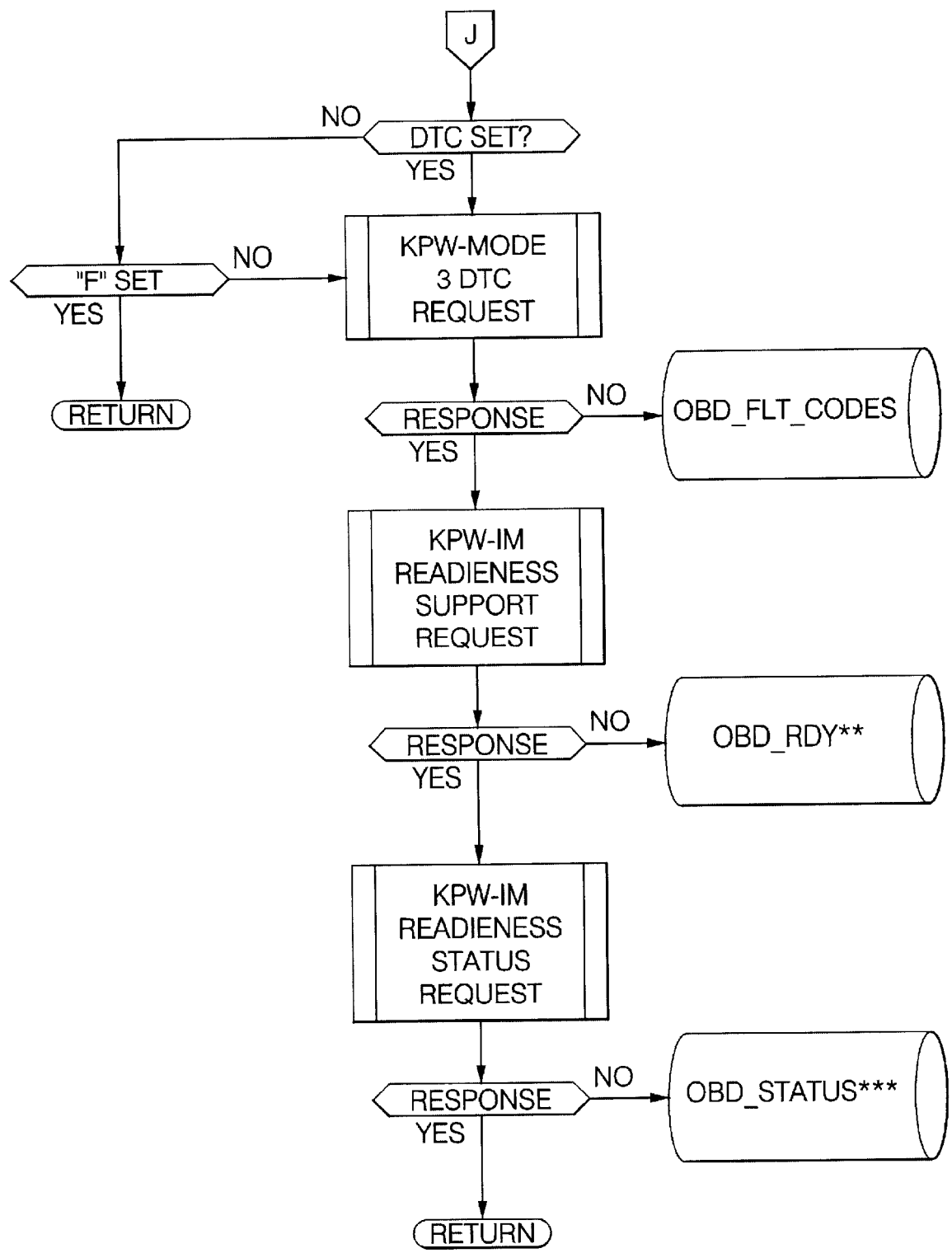

In an exemplary integration of test prompts with the actual test sequence, the inspection eventually proceeds from the screen shown in FIG. 11 to the final screen shown in FIG. 12, assuming communication is successfully established. Text messages concerning the countdown of time and the progress of the test may also be displayed before arriving at the screen in FIG. 12. At this point, the test results may then be printed out. However, if communication is not successfully established, then the inspection process proceeds from the screen displayed in FIG. 11 to the screens shown in FIGS. 13–14, wherein the inspector attempts to test the vehicle again. If continued attempts fail, then the process proceeds to the screen in FIG. 9, where the test is completed as a failure.

The above described testing procedure and possible outcomes may be understood in greater detail as a whole with reference to the flow diagrams of FIGS. 15a–15e and FIGS. 16a–16f. FIGS. 15a–15e illustrate exemplary logic behind one possible method embodiment as the analyzer 10. The method first determines if the vehicle is OBD equipped, and if so proceeds through the appropriate KOEO test for the vehicle. The method then determines if the vehicle is problematic so as to require an IM subroutine, and determines whether the connector is intact and instructs the inspector to connect the analyzer to the on-board computer. Attempts are made to establish communication (several times if necessary). Then the MIL status is checked, with any diagnostic trouble codes (DTCs) being downloaded, while the individual monitors are checked to assess readiness criteria if the vehicle is not problematic. The method further stores the Parameter Identification (PID) and the Module Identification information, analyzes the flags, and finally prints the results.

One skilled in the art will recognize that although the implementation disclosed herein sets flags for analysis at the end of the procedure, and only otherwise fails the vehicle earlier in the test if the connector is missing or communication can otherwise not be established, different logical procedures may be used to carry out the OBD analysis. Similarly, the exemplary logic depicted in FIGS. 16a–16f for RS232c communications may also be realized in equivalent ways as known to those skilled in the art.

Finally, it will be recognized that architectures for the testing system generally depicted in FIGS. 1a–1d may be combined to meet the needs of a client. For example, a combination of all three architectures is possible. Furthermore, as will be readily apparent to one skilled in the art, a server-based configuration is not the only possible implementation, since the stand-alone unit may support a single software module dedicated to accomplishing the above described testing methodology absent a server/client bifurcation.

While the invention has been described with reference to a preferred embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for on-board diagnostics testing of a vehicle under inspection, the method comprising:

configuring a user interface in communication with a software system;

configuring a communications link in communication with said software system, said software system capable of communicating with an on-board vehicle computer system; and configuring an analysis and reporting module in communication with said software system;

wherein said software system manages said user interface, said communications link, and said analysis and reporting module in a manner guiding an inspector through an inspection of the vehicle; and wherein an inspection of the vehicle includes an analysis of the on-board vehicle computer system.

2. The method of claim 1, further comprising:

receiving inputted vehicle data fields for the vehicle under inspection;

comparing said inputted vehicle data fields to data contained in a vehicle lookup table; and determining whether the vehicle under inspection is subject to on-board diagnostics testing;

wherein, if the vehicle under inspection is subject to on-board diagnostics testing, then said software system guides an inspector through a vehicle inspection process.

3. The method of claim 2, further comprising:

if said vehicle under inspection is subject to on-board diagnostic testing, then determining, based upon said inputted vehicle data fields and said data contained in said vehicle lookup table, whether the vehicle under inspection is subject to a standardized test procedure or a specialized test procedure corresponding to the vehicle under inspection;

wherein, if it is determined that the vehicle under inspection is subject to a specialized test procedure, then said software system guides the inspector through said specialized test procedure.

4. The method of claim 2, further comprising:

directing the inspector to locate an on-board diagnostic connector in the vehicle under inspection;

wherein information on the location of said on-board diagnostic connector is also included in said vehicle lookup table.

5. The method of claim 4, further comprising:

establishing communication between said analysis and reporting module and said on-board vehicle computer system;

verifying the operational status of a malfunction indicator light (MIL) included within said vehicle under inspection;

determining whether said MIL has been commanded on during the operation of said vehicle under inspection; and retrieving and storing vehicle diagnostic trouble codes.

6. The method of claim 4, further comprising:

determining a readiness status for each of a set of vehicle parameter monitors, said readiness status indicative of whether a given vehicle parameter monitor has had sufficient time to monitor the parameter associated therewith;

wherein a possible readiness status for each vehicle parameter monitor includes one of: completed, not completed, and not enabled.

7. The method of claim 6, wherein said set of vehicle parameter monitors includes at least one of: a misfire, a fuel system, a comprehensive component, a catalyst, a heated catalyst, an evaporative system, a secondary air system, an air conditioning system, an oxygen sensor, an oxygen sensor heater, and an exhaust gas recirculation system monitor.

8. A vehicle analysis system for use with vehicles having on-board diagnostics, the system comprising:

a software system;

a user interface in communication with said software system;

a communications link in communication with said software system for communicating with an on-board vehicle computer system; and an analysis and reporting module in communication with said software system;

wherein said software system manages said user interface, said communications link, and said analysis and reporting module in a manner guiding an inspector through an inspection of the vehicle; and wherein the inspection of the vehicle includes an analysis of the on-board vehicle computer system.

9. The vehicle analysis system of claim 8, wherein said analysis and reporting module employs an on-board diagnostics testing method, the method further comprising:

receiving inputted vehicle data fields for a vehicle under inspection;

comparing said inputted vehicle data fields to data contained in a vehicle lookup table; and determining whether said vehicle under inspection is subject to on-board diagnostics testing;

wherein, if said vehicle under inspection is subject to on-board diagnostics testing, then said software system guides an inspector through a vehicle inspection process.

10. The vehicle analysis system of claim 9, wherein the on-board diagnostics testing method further comprises:

if said vehicle under inspection is subject to on-board diagnostic testing, then determining, based upon said inputted vehicle data fields and said data contained in said vehicle lookup table, whether said vehicle under inspection is subject to a standardized test procedure or a specialized test procedure corresponding to said vehicle under inspection;

wherein, if it is determined that said vehicle under inspection is subject to a specialized test procedure, then said software system guides the inspector through said specialized test procedure.

11. The vehicle analysis system of claim 9, wherein the on-board diagnostics testing method further comprises:

directing the inspector to locate an on-board diagnostic connector in said vehicle under inspection;

wherein information on the location of said on-board diagnostic connector is also included in said vehicle lookup table.

12. The vehicle analysis system of claim 11, wherein the on-board diagnostics testing method further comprises:

establishing communication between said analysis and reporting module and said on-board vehicle computer system;

verifying the operational status of a malfunction indicator light (MIL) included within said vehicle under inspection;

determining whether said MIL has been commanded on during the operation of said vehicle under inspection; and retrieving and storing vehicle diagnostic trouble codes.

13. The vehicle analysis system of claim 11, wherein the on-board diagnostics testing method further comprises:

determining a readiness status for each of a set of vehicle parameter monitors, said readiness status indicative of whether a given vehicle parameter monitor has had sufficient time to monitor the parameter associated therewith;

wherein a possible readiness status for each vehicle parameter monitor includes one of: completed, not completed, and not enabled.

14. The vehicle analysis system of claim 13, wherein said set of vehicle parameter monitors includes at least one of: a misfire, a fuel system, a comprehensive component, a catalyst, a heated catalyst, an evaporative system, a secondary air system, an air conditioning system, an oxygen sensor, an oxygen sensor heater, and an exhaust gas recirculation system monitor.

15. The vehicle analysis system of claim 9, further comprising bar code scanning means in communication with said software system for scanning vehicle data fields for a vehicle under inspection, wherein said vehicle data fields include at least one of: a make, a model, and a model year of a registered vehicle.

16. The vehicle analysis system of claim 8, further comprising a server system, wherein said analysis and reporting module is resident at a server location, and wherein a client calls said analysis and reporting module from a client location.

17. The vehicle analysis system of claim 16, wherein said client location is the same as said server location.

18. The vehicle analysis system of claim 16, wherein said client location is physically networked with said server location.

19. The vehicle analysis system of claim 16, wherein said client location is wirelessly networked with said server location.

* * * * *